(12) United States Patent
Ito

(10) Patent No.: US 10,085,340 B2
(45) Date of Patent: Sep. 25, 2018

(54) FLAT CIRCUIT BODY WITH TERMINAL AND MANUFACTURING METHOD THEREOF

(71) Applicant: YAZAKI CORPORATION, Tokyo (JP)

(72) Inventor: Naoki Ito, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 12 days.

(21) Appl. No.: 14/327,235

(22) Filed: Jul. 9, 2014

(65) Prior Publication Data

US 2014/0318849 A1    Oct. 30, 2014

Related U.S. Application Data

(63) Continuation of application No. PCT/JP2013/051360, filed on Jan. 17, 2013.

(30) Foreign Application Priority Data

Jan. 18, 2012    (JP) ................................. 2012-008071

(51) Int. Cl.
    *H05K 1/03*        (2006.01)
    *H05K 1/11*        (2006.01)
    (Continued)

(52) U.S. Cl.
    CPC ............... *H05K 1/11* (2013.01); *H01R 4/182* (2013.01); *H01R 12/69* (2013.01); *H01R 43/048* (2013.01)

(58) Field of Classification Search
    CPC . H01B 7/08; H01B 7/00; H01B 13/00; H01R 12/08; H01R 12/38; H01R 4/18;
    (Continued)

(56) References Cited

U.S. PATENT DOCUMENTS 4,551,579 A * 11/1985 Takasaki ................ H01R 12/67
                                                                        174/117 FF
4,815,990 A * 3/1989 Ristedt ..................... H01R 12/61
                                                                        29/846
(Continued)

FOREIGN PATENT DOCUMENTS

CN           101842939 A     9/2010
EP             1130687 A2 *    9/2001 ........... H01R 12/592
(Continued)

OTHER PUBLICATIONS

JP2002184246 translation, Patent Translate, Aug. 16, 2015.*
(Continued)

*Primary Examiner* — Timothy Thompson
*Assistant Examiner* — Guillermo Egoavil
(74) *Attorney, Agent, or Firm* — Kenealy Vaidya LLP

(57) ABSTRACT

A portion of a flat conductor is exposed from an insulating layer covering at least one of surfaces of the flat conductor. A terminal includes a bottom plate on which the exposed portion of the flat conductor is provided, and crimp claws which are raised at two side edges of the bottom plate so that the exposed portion is disposed therebetween. The exposed portion is folded so as to define a bottom layer which faces the bottom plate and a top layer which faces opposite to the bottom plate. The top layer is configured to be plastically deformed so as to fill a gap between the top layer and inner surfaces of the crimp claws when the crimp claws are crimped onto the top layer, so that the bottom layer is in surface contact with the bottom plate.

6 Claims, 26 Drawing Sheets

(51) Int. Cl.
*H01R 4/18* (2006.01)
*H01R 12/69* (2011.01)
*H01R 43/048* (2006.01)

(58) Field of Classification Search
CPC .......... H01R 4/20; H01R 4/182; H01R 4/185;
H01R 12/59; H01R 12/69; H01R 12/70;
H01R 12/592; H01R 13/11; H01R 13/58;
H01R 43/048; H02G 3/38; H05K 1/11
USPC .................. 174/255, 110; 439/877, 422, 164
See application file for complete search history.

(56) References Cited

U.S. PATENT DOCUMENTS

| | | | |
|---|---|---|---|
| 6,086,433 A * | 7/2000 | Hils et al. ..................... | 439/849 |
| 6,305,970 B1 | 10/2001 | Nagai et al. | |
| 6,686,544 B2 * | 2/2004 | Inoue ...................... | H01B 7/08 |
| | | | 174/117 F |
| 8,221,171 B2 | 7/2012 | Ono et al. | |
| 8,628,335 B1 * | 1/2014 | Zhao ................... | 439/33 |
| 2002/0170738 A1 * | 11/2002 | Inoue ...................... | H01B 7/08 |
| | | | 174/110 R |
| 2005/0189130 A1 * | 9/2005 | Bertini et al. .............. | 174/25 C |
| 2005/0227550 A1 | 10/2005 | Takayama | |
| 2007/0093101 A1 | 4/2007 | Kumakura | |
| 2007/0111613 A1 * | 5/2007 | Kumakura ............. | H01R 4/182 |
| | | | 439/851 |
| 2007/0161289 A1 * | 7/2007 | Alloway et al. ............. | 439/606 |
| 2009/0269970 A1 | 10/2009 | Kumakura | |
| 2010/0018768 A1 * | 1/2010 | Takahashi et al. ......... | 174/74 R |
| 2010/0230160 A1 * | 9/2010 | Ono et al. ..................... | 174/84 |
| 2010/0261391 A1 * | 10/2010 | Ono ..................... | H01R 4/185 |
| | | | 439/877 |

FOREIGN PATENT DOCUMENTS

| | | |
|---|---|---|
| EP | 1 253 684 A2 | 10/2002 |
| GB | 2 203 905 A | 10/1988 |
| JP | 52-142682 U | 10/1977 |
| JP | 10-125439 A | 5/1998 |
| JP | 2002-184246 A | 6/2002 |
| JP | 2009-117039 A | 5/2009 |
| JP | 2009-283458 A | 12/2009 |
| JP | 4520929 B2 | 8/2010 |

OTHER PUBLICATIONS

International Search Report and Written Opinion of the International Search Report for PCT/JP2013/051360 dated Mar. 25, 2013.
Korean Office Action for the related Korean Patent Application No. 10-2014-7019712 dated Oct. 12, 2015.
Chinese Office Action for the related Chinese Patent Application No. 201380006088.1 dated Oct. 28, 2015.
Chinese Office Action for the related Chinese Patent Application No. 201380006088.1 dated May 5, 2016.
The Decision on Rejection of Chinese Office Action for the related Chinese Patent Application No. 201380006088.1 dated Oct. 17, 2016.
Chinese Notification of Reexamination for the related Chinese Patent Application No. 201380006088.1 dated Jun. 21, 2017.
Japanese Office Action for the related Japanese Patent Application No. 2012-008071 dated Jul. 14, 2015.
Chinese Notification of Reexamination for the related Chinese Patent Application No. 201380006088.1 dated Oct. 26, 2017.
Chinese Reexamination Decision for the related Chinese Patent Application No. 201380006088.1 dated Apr. 24, 2018.

\* cited by examiner

FLAT CIRCUIT BODY WITH TERMINAL AND MANUFACTURING METHOD THEREOF

CROSS REFERENCE TO RELATED APPLICATIONS

This application is a continuation of PCT application No. PCT/JP2013/051360, which was filed on Jan. 17, 2013 based on Japanese Patent Application (No. 2012/008071) filed on Jan. 18, 2012, the contents of which are incorporated herein by reference.

BACKGROUND OF THE INVENTION

1. Field of the Invention

The present invention is related to a flat circuit body with terminal in which terminals are crimped to connect to a plurality of flat conductors of the flat circuit body which is formed to a planar wiring member by covering at least one side of surfaces of the flat conductors, which are separated at a predetermined interval and arranged into a planar shape, with insulating layers, and a manufacturing method of the flat circuit body with terminals.

2. Description of the Related Art

A wiring member which has flexibility such as an FPC (that is, Flexible Printed Circuit), an FFC (that is, Flexible Flat Cable) or a ribbon electric wire corresponds to the flat circuit body.

FIGS. 25 and 26 show a conventional embodiment of a flat circuit body with terminals.

A flat circuit body with terminals 100 is disclosed in PTL 1. The flat circuit body with terminals 100 includes a flat circuit body 110 and terminals 120 which are crimped to connect to the flat circuit body 110.

The flat circuit body 110 is manufactured to a planar wiring member by covering a plurality of flat conductors 111, which are separated at a predetermined interval and arranged into a planar shape, with insulating layers 112.

A conductor exposed portion DR1 where the insulating layers 112 are stripped to expose the flat conductors 111 is formed in the flat circuit body 110. Further, by folding the middle part of the conductor exposed portion DR1 in the length direction to make two layers of the flat conductors 111 overlap each other, a conductor folded portion DK1 is formed in the flat circuit body 110.

The terminal 120 which connects to the flat circuit body 110 is a press formed article which is made of a metal plate, and includes a terminal fitting part 121 with which a mating terminal is fitted to connect, and a circuit body connecting part 122 to connect the flat circuit body 110, as shown in FIG. 26.

The circuit body connecting part 122 includes a bottom plate 122a on which the conductor folded portion DK1 is carried, and crimp claws 122b which are raised at two side edges of the bottom plate 122a and are crimped to the conductor folded portion DK1 which is carried on the bottom plate 122a.

As shown in FIG. 26, by crimping the crimp claws 122b to the conductor folded portion DK1 which is carried on the bottom plate 122a, the flat circuit body with terminals 100 of PTL 1 reaches a state that the terminals 120 are crimped to connect to the flat conductors 111.

In the flat circuit body with terminals 100 of PTL 1, with the construction that the crimp claws 122b of the terminal 120 are crimped to the conductor folded portion DK1, when compared with a case of simply crimping the circuit body connecting part 122 to one layer of the flat conductor 111, mechanical connection strength can be improved.

CITATION LIST

Patent Literature

[PTL 1] JP-A-2002-184246

SUMMARY OF THE INVENTION

In the terminal 120 used in the flat circuit body with terminals 100 in PTL 1, as shown in FIG. 25, the crimp claws 122b provided at the two side edges of the bottom plate 122a are arranged in a zigzag form to shift from each other in position in the length direction of the bottom plate 122a to be not opposed to each other in the width direction of the bottom plate 122a.

Therefore, when crimp claws 122b at one side of the bottom plate 122a are crimped to the conductor folded portion DK1, at the other side of the bottom plate 122a opposed to these crimp claws 122b, the conductor folded portion DK1 rises from the bottom plate 122a, and the overall width of the flat conductor 111 cannot contact with the bottom plate 122a equally. As a result, between the flat conductor 111 and the terminal 120, there is a problem that it is difficult to improve the electrical connection performance by increasing the contact area.

Furthermore, in the case of the flat circuit body with terminals 100 in the PTL 1, the structure of crimping the crimp claws 122b to the conductor folded portion DK1 and the degree of crimping are not recorded in detail, and a variation in the mechanical connection strength or in the electrical connection performance might occur due to the crimping of the crimp claws 122b.

It is therefore one advantageous aspect of the present invention to provide a flat circuit body with terminals so that not only a high connection strength at the crimped part of the terminal can be secured, but also by making the overall width of the flat conductor of the flat conductor to contact with the terminal equally, electrical connection performance can be improved by the increase of the contact area, and besides, since the structure of crimping the crimp claws and the degree of crimping are prescribed, a variation of mechanical connection strength or electrical connection performance of the terminal can be prevented by crimping the crimp claws.

According to one advantage of the invention, there is provided a flat circuit body with a terminal, comprising:
- a flat circuit body including a flat conductor and an insulating layer covering at least one of surfaces of the flat conductor, a portion of the flat conductor being exposed from the insulating layer; and
- a terminal including a bottom plate on which the exposed portion of the flat conductor is provided, and crimp claws which are raised at two side edges of the bottom plate so that the exposed portion of the flat conductor is disposed therebetween, wherein
- the exposed portion of the flat conductor is folded so as to define a bottom layer which faces the bottom plate and a top layer which faces opposite to the bottom plate, and
- the top layer is configured to be plastically deformed so as to fill a gap between the top layer and inner surfaces of the crimp claws when the crimp claws are crimped onto the top layer, so that the bottom layer is in surface contact with the bottom plate.

The flat circuit body with the terminal may be configured such that: the top layer includes a tip end of the exposed portion of the flat conductor, and the bottom layer is connected to a portion covered by the insulating layer.

The flat circuit body may include a plurality of flat conductors which are arranged in a planar shape with separated at a predetermined interval.

The insulating layer may be formed with slits penetrating the flat circuit body in a thickness direction thereof at a predetermined interval along edges of the flat conductors between the flat conductors adjacent each other.

Serrations may be formed on a surface of the bottom plate facing the exposed portion of the flat conductor and the inner surface of the crimp claws.

According to the present invention, with the structure that the crimp claws of the terminal are crimped to the conductor folded portion in which a plurality of flat conductors are overlapped, when compared with a case of simply crimping the circuit body connecting part to one layer of the flat conductor, mechanical connection strength can be improved and a high connection strength in the crimped portion of the terminal can be secured.

Since the crimp claws which are crimped to the conductor folded portion are raised in opposed positions at the two side edges of the bottom plate of the terminal, crimp forces can be equally applied at both sides of the bottom plate. Therefore, the overall width of the flat conductor of the flat circuit body contacts with the terminal equally so that electrical connection performance can be improved by the increase of the contact area.

In addition, since the structure of crimping the crimp claws and the degree of crimping are prescribed so that when the crimp claws are crimped, the bottom layer flat conductor, which is at the base side (body side of the flat circuit body), contacts with the bottom plate in a surface contact state, and the top layer, which is at the side opposite to the base side, is deformed plastically to be buried into gaps between the top layer and the curved crimp claws to contact with the inner surfaces of the crimp claws, a variation of the mechanical connection strength or electrical connection performance of the terminal can be prevented by crimping the crimp claws.

According to the invention, since the insulating layers between adjacent flat conductors of the flat circuit body are provided with slits, the cutting operation becomes easy. Therefore, when the conductor exposed portion is formed in which a plurality of the flat conductors of the flat circuit body are separated from each other in the widthwise direction, the forming operation of the conductor exposed portion can be performed easily.

Even if the conductor exposed portion has such a form that the insulating layers between adjacent flat conductors are left, by inserting the crimp claws of the terminal into the slits, a state that the conductor folded portion is carried on the bottom plate of the terminal can be easily reached, and a step of mounting the terminal to the flat circuit body can be performed easily.

According to the invention, since the serrations are formed in the bottom plate and the crimp claws, connection strength can be further improved by crimping the crimp claws, and contact resistance can be stabilized.

According to the invention, not only a high connection strength at the crimped part of the terminal can be secured, but also electrical connection performance can be improved by the increase of the contact area in the crimped part. Besides, the flat circuit body with terminals for which a variation of mechanical connection strength or electrical connection performance of the terminal can be prevented by crimping the crimp claws can be manufactured.

According to the flat circuit body with terminals of the invention, with the structure that the crimp claws of the terminal are crimped to the conductor folded portion in which a plurality of flat conductors are overlapped, when compared with a case of simply crimping the circuit body connecting part to one layer of the flat conductor, mechanical connection strength can be improved and a high connection strength in the crimped portion of the terminal can be secured.

Since the crimp claws which are crimped to the conductor folded portion are raised in opposed positions at the two side edges of the bottom plate of the terminal, the overall width of the flat conductor of the flat circuit body contacts with the terminal equally so that electrical connection performance can be improved by the increase of the contact area.

In addition, since the structure of crimping the crimp claws and the degree of crimping are prescribed so that when the crimp claws are crimped, the bottom layer flat conductor, which is at the base side, contacts with the bottom plate in a surface contact state, and the top layer, which is at the side opposite to the base side, is deformed plastically to be buried into gaps between the top layer and the curved crimp claws to contact with the inner surfaces of the crimp claws, a variation of the mechanical connection strength or electrical connection performance of the terminal can be prevented by crimping the crimp claws.

BRIEF DESCRIPTION OF THE DRAWINGS

FIGS. 9A and 9B show a bottom plate and crimp claws of the terminal according to another embodiment of the present invention, in which FIG. 9A is an expanded view of an embodiment of changing the shape of serrations, and FIG. 9B is an expanded view of an embodiment of replacing the serrations with a simple flat smooth surface.

DETAILED DESCRIPTION OF THE EXEMPLARY EMBODIMENTS

Figure 1:
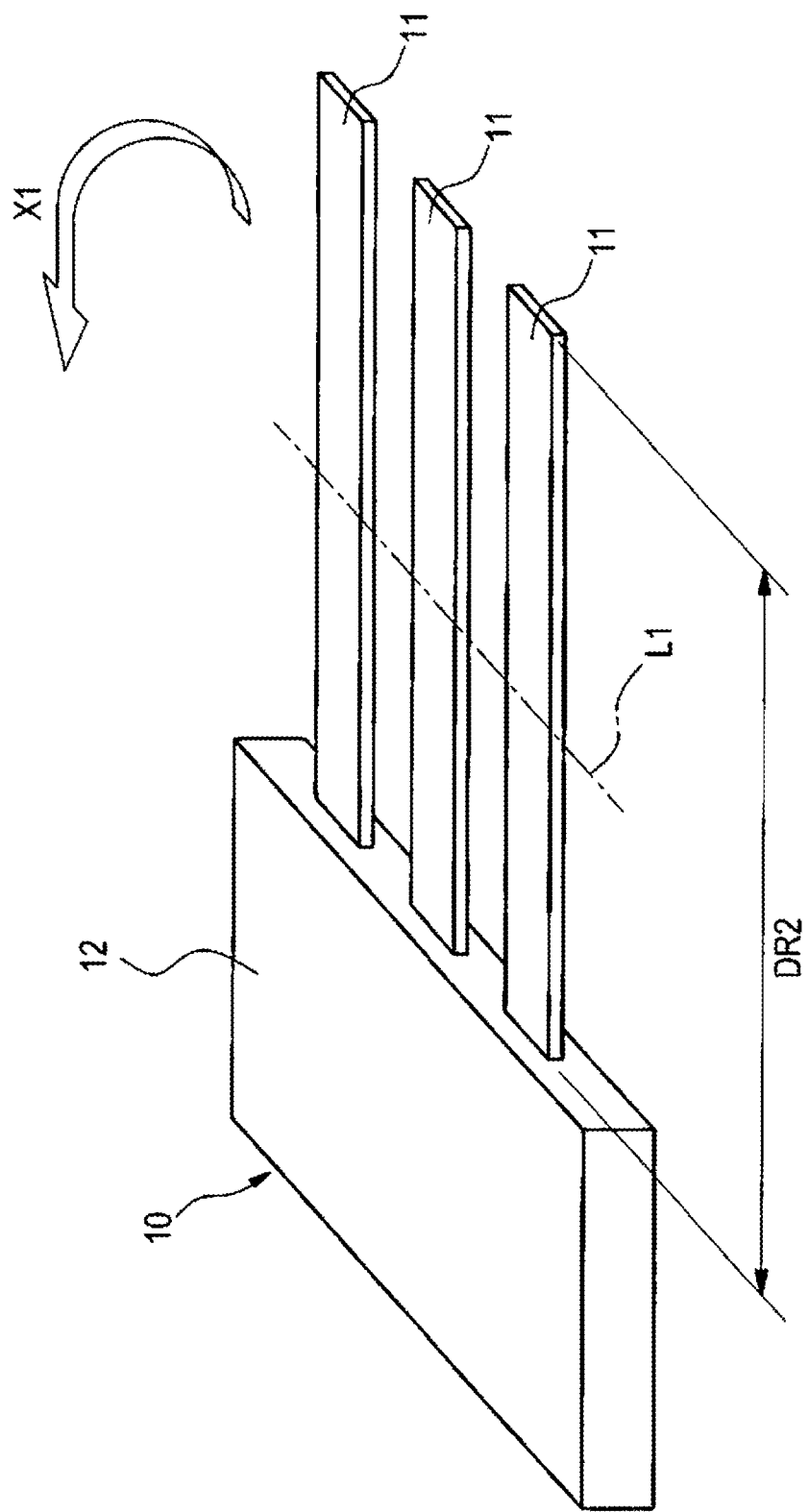
FIG. 1 is a perspective view of a conductor exposed portion formed in a flat circuit body according to a first embodiment of the present invention.
Figure 2:
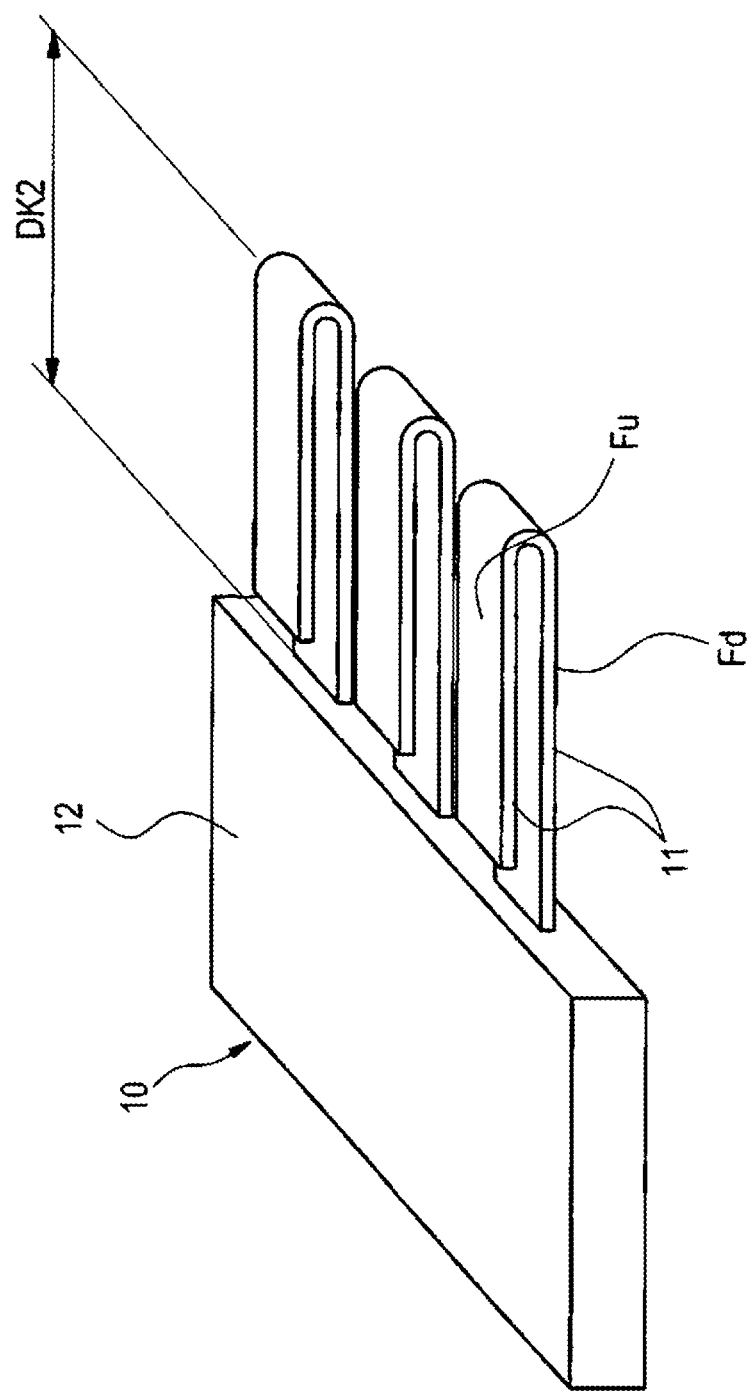
FIG. 2 is a perspective view of a conductor folded portion formed from the conductor exposed portion shown in FIG. 1.
Figure 3:
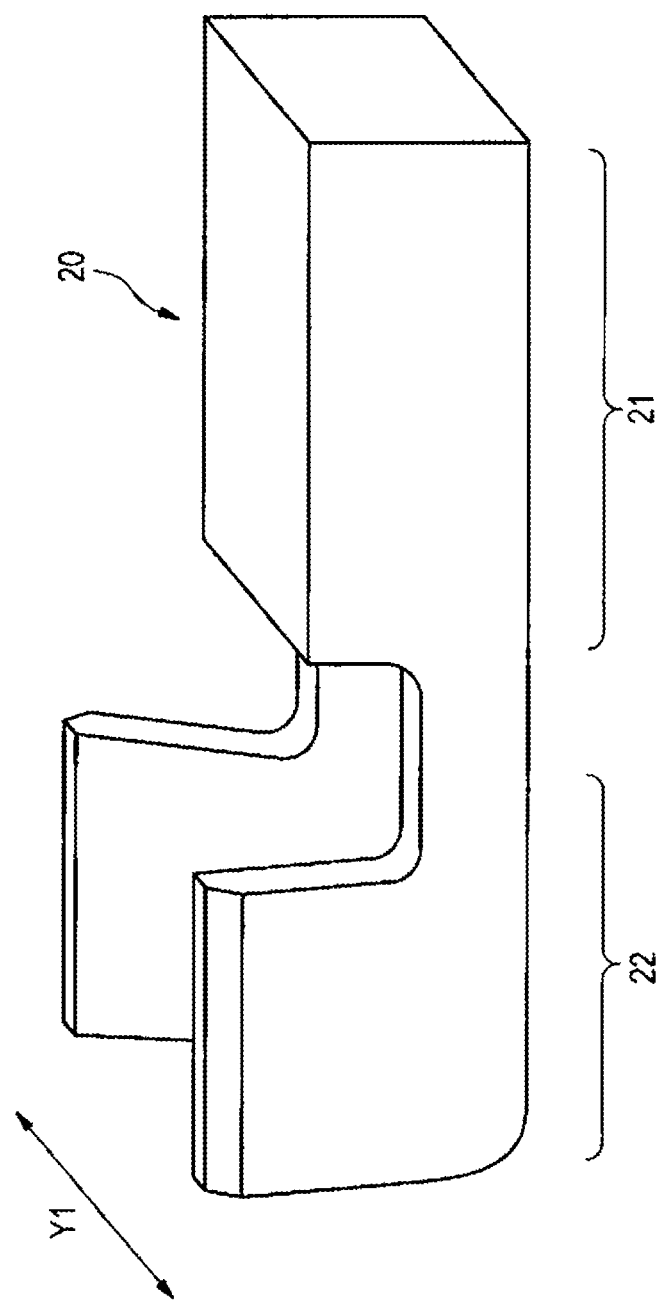
FIG. 3 is a perspective view of a terminal according to the first embodiment of the present invention.
Figure 4:
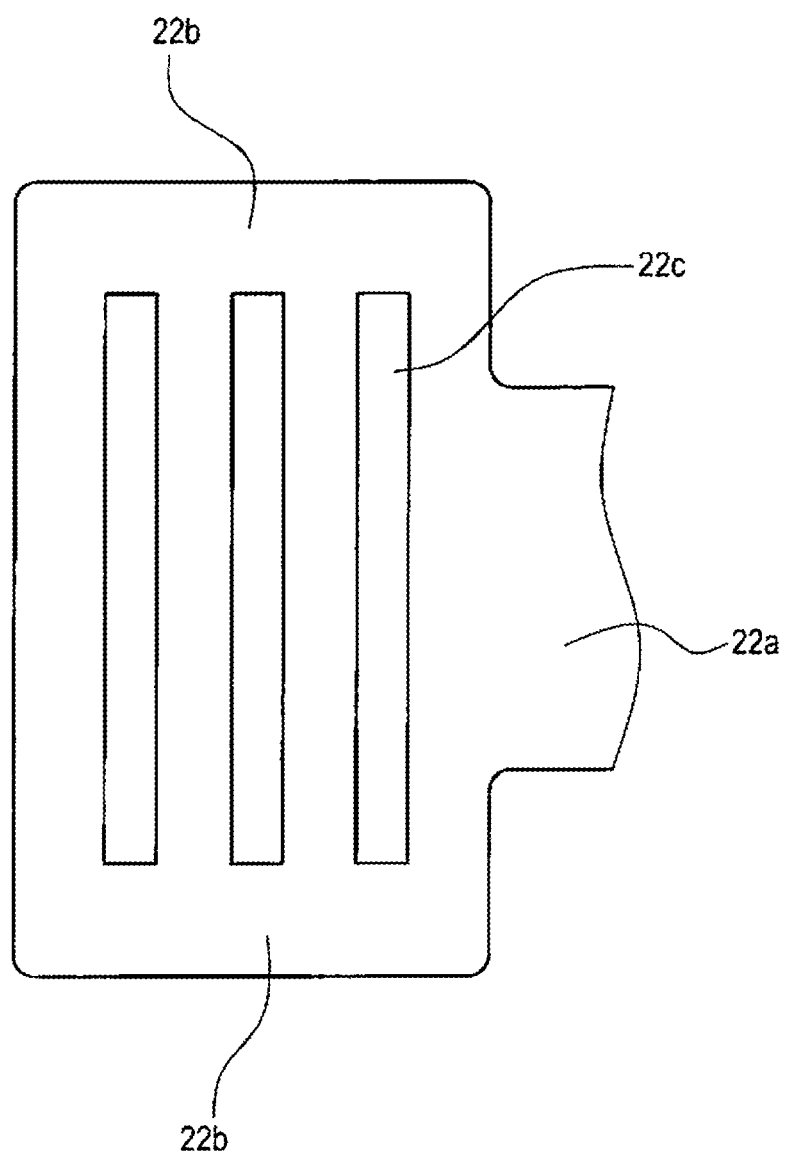
FIG. 4 is an expanded view of a bottom plate and crimp claws of the terminal shown in FIG. 3.
Figure 5:
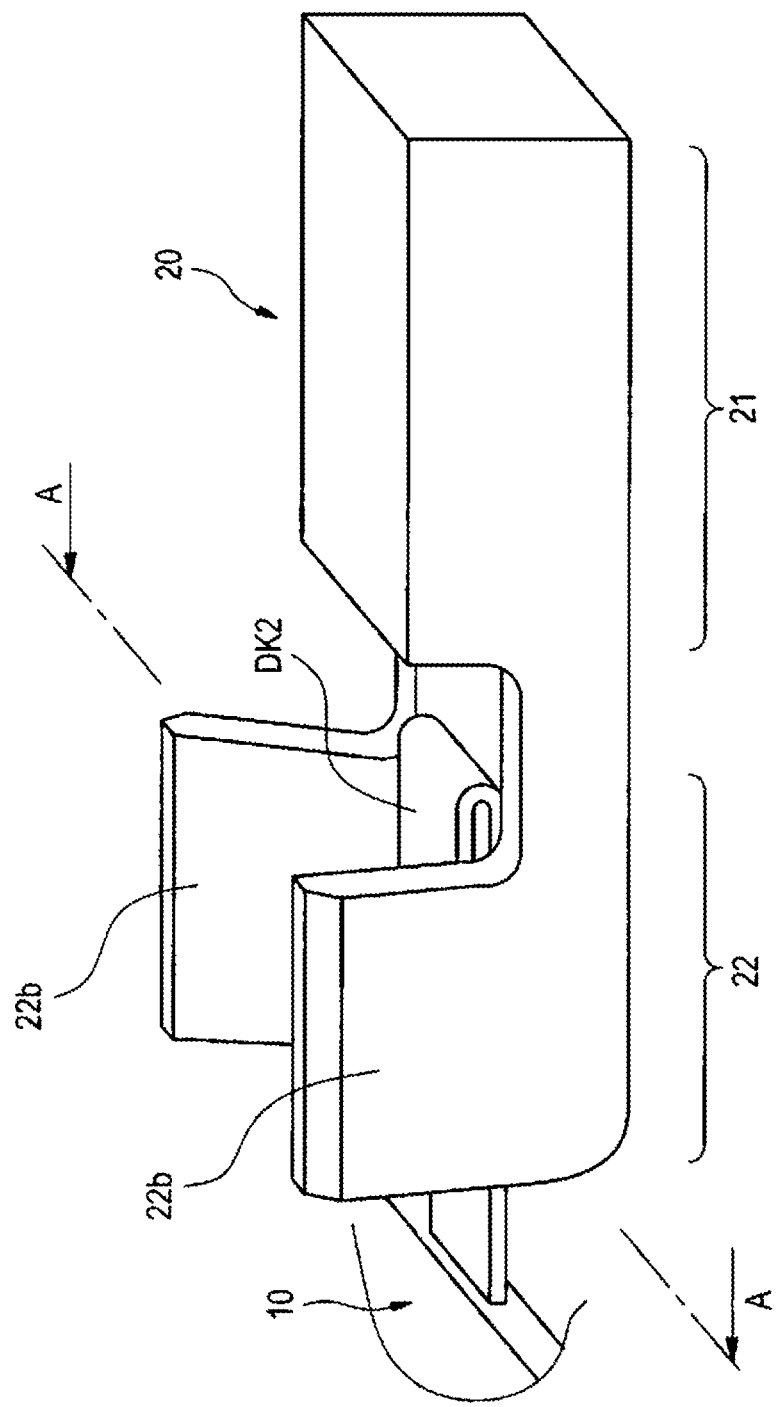
FIG. 5 is a perspective view which shows a state that the conductor folded portion shown in FIG. 2 is carried on the bottom plate in a circuit body connecting part of the terminal shown in FIG. 3.
Figure 6:
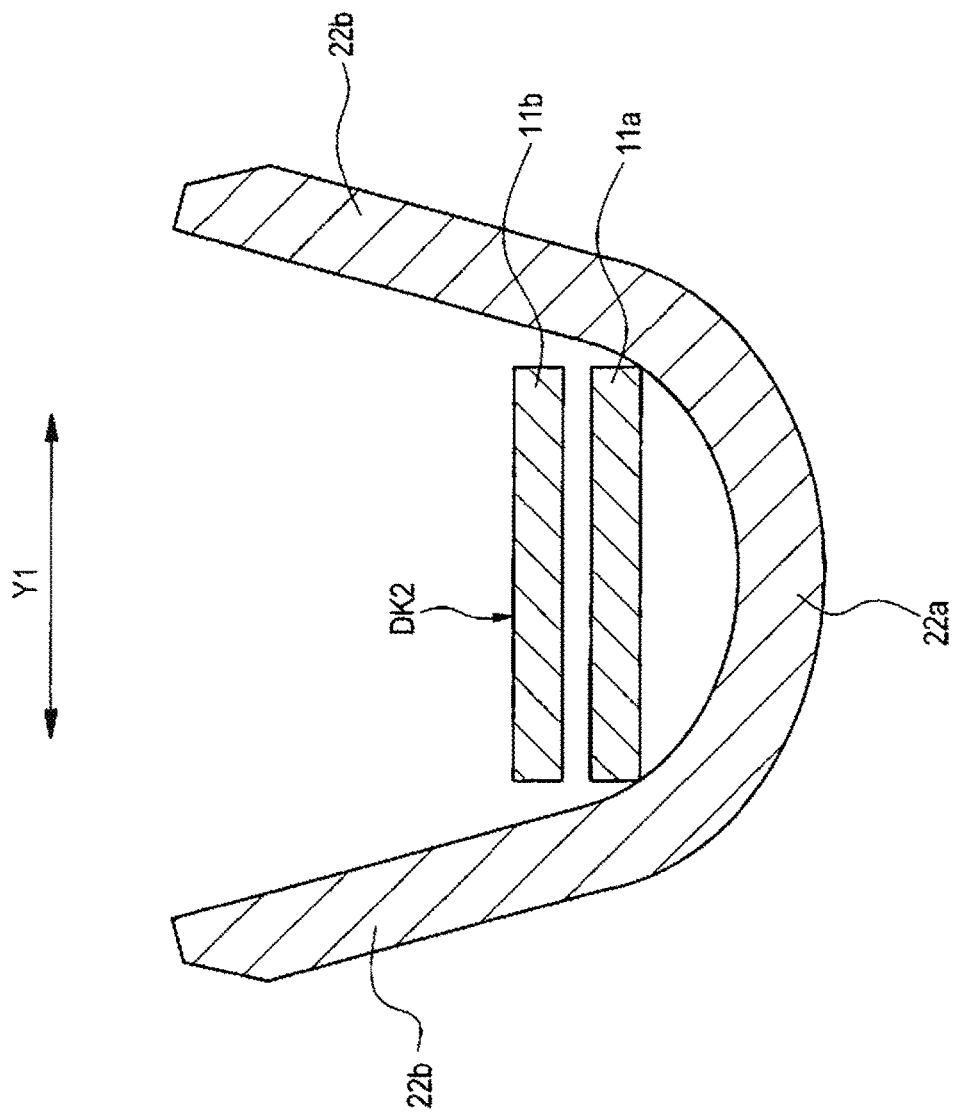
FIG. 6 is an A-A sectional view of FIG. 5.
Figure 7:
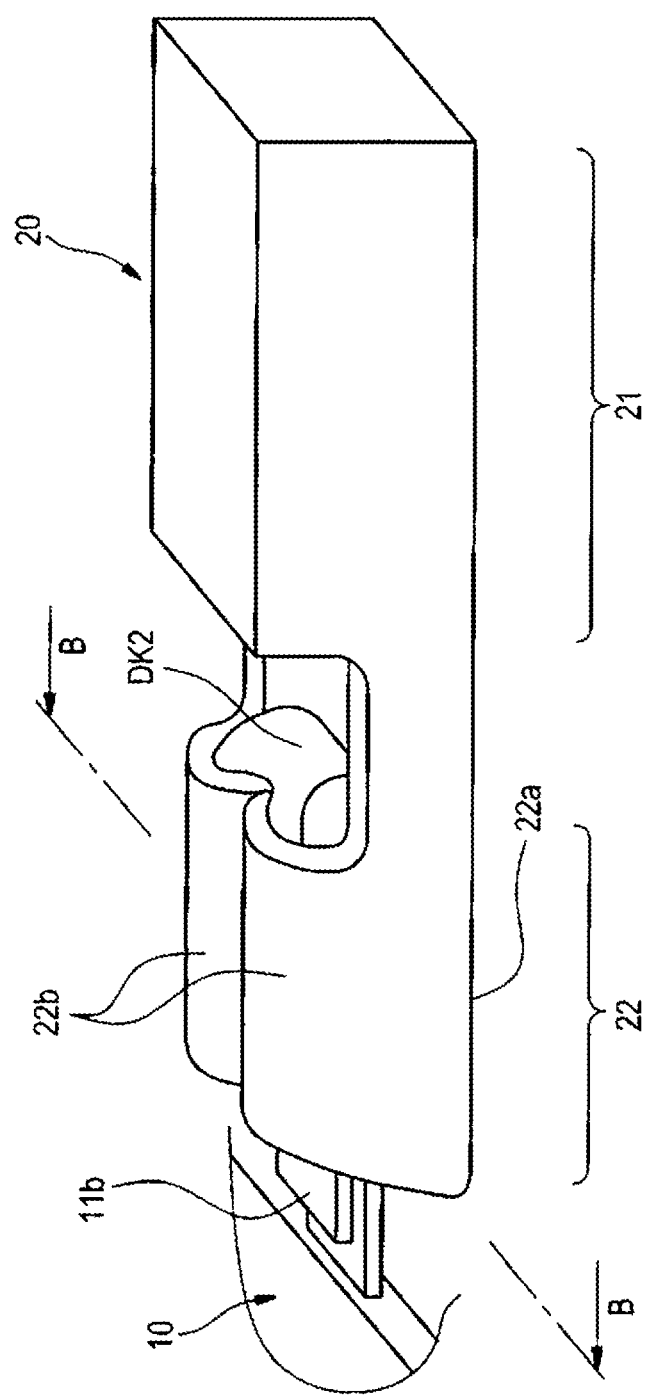
FIG. 7 is a perspective view which shows a completed state of the crimping of the crimp claws from the state shown in FIG. 5.
Figure 8:
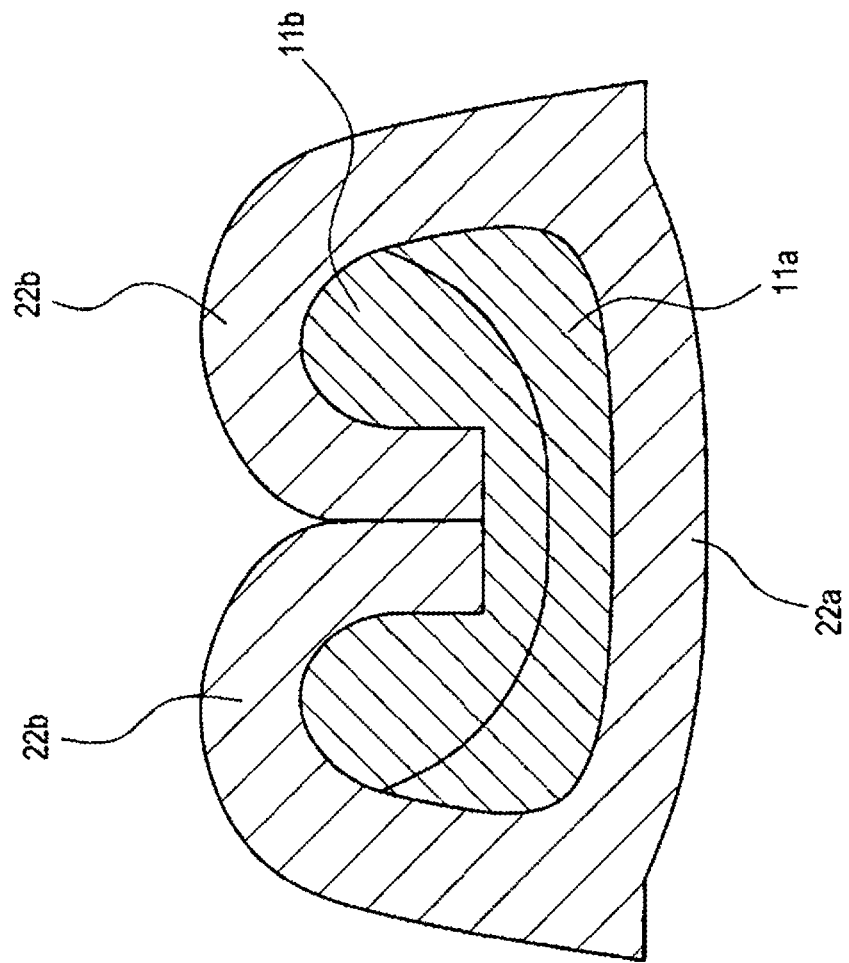
FIG. 8 is a B-B sectional view of FIG. 7.

FIGS. 1 to 8 show a first embodiment of a flat circuit body with terminals and a manufacturing method of the flat circuit body with terminals according to the present invention. FIG. 1 is a perspective view of a conductor exposed portion formed in a flat circuit body according to a first embodiment of the present invention. FIG. 2 is a perspective view of a conductor folded portion formed from the conductor exposed portion shown in FIG. 1. FIG. 3 is a perspective view of a terminal according to the first embodiment of the present invention. FIG. 4 is an expanded view of a bottom plate and crimp claws of the terminal shown in FIG. 3. FIG. 5 is a perspective view which shows a state that the conductor folded portion shown in FIG. 2 is carried on the bottom plate in a circuit body connecting part of the terminal shown in FIG. 3. FIG. 6 is an A-A sectional view of FIG. 5. FIG. 7 is a perspective view which shows a completed state of the crimping of the crimp claws from the state shown in FIG. 5. FIG. 8 is a B-B sectional view of FIG. 7.

A flat circuit body with terminals 1 of the embodiment includes a flat circuit body 10 and terminals 20 which are crimped to connect the flat circuit body 10.

The flat circuit body 10 is formed to a planar wiring member by covering a plurality of flat conductors 11, which are separated at a predetermined interval and arranged into a planar shape, with insulating layers 12.

In particular, a wiring member which has flexibility such as an FPC Flexible Printed Circuit), an FFC (Flexible Rat Cable) or a ribbon electric wire corresponds to the flat circuit body 10. The flat circuit body 10 corresponds to, for example, a flat circuit body in which surfaces at both sides of the flat conductors 11 are covered with insulating layers 12, and the flat conductors 11 are exposed by stripping a part of the insulating layers 12 of the surfaces at one side, a flat circuit body in which surfaces at one side of the flat conductors 11 are covered with insulating layers 12 and the other surfaces are exposed, or a flat circuit body in which surfaces at one side of the flat conductors 11 are covered with insulating layers 12, and a part of the surfaces at the other side are further covered with insulating layers 12.

A conductor exposed portion DR2 where the insulating layers 12 are stripped to expose the flat conductors 11 is formed in the flat circuit body 10. In the conductor exposed portion DR2 in the present embodiment, the insulating layers 12 covering both sides of the flat conductors 11 and the insulating layers 12 between adjacent flat conductors 11 are removed. Therefore, the flat conductors 11 of the conductor exposed portion DR2 become exposed to the outside at both sides.

Further, in the flat circuit body 10 of the present embodiment, by folding the middle part of the conductor exposed portion DR2 one time in the length direction, as shown with the arrow X1 in FIG. 1, a conductor folded portion DK2 in which two layers of the flat conductors 11 overlap each other as shown in FIG. 2 is formed. A straight line L1 shown in FIG. 1 shows a folding position of the flat conductors 11. In the conductor folded portion DK2, the flat conductors 11 are exposed at each of a bottom layer Fd which is at a base side (the side of the flat circuit body) and a top layer Fu which is at the side opposite to the base side.

The terminal 20 which is connected to the flat circuit body 10 is a press formed article that is made of a metal plate, and as shown in FIG. 3, includes a generally square pipe-like terminal fitting part 21 with which a mating terminal 20 is fitted and connected, and a circuit connecting part 22 to connect the flat circuit body 10.

The circuit connecting part 22 includes a bottom plate 22a on which the conductor folded portion DK2 is mounted, and crimp claws 22b which are raised at two side edges of the bottom plate 22a and are crimped to the conductor folded portion DK2 which is mounted on the bottom plate 22a, as shown in FIG. 6.

The bottom plate 22a is adapted to be able to mount the flat conductor 11 in the flat circuit body 1. In the present embodiment, the crimp claws 22b of the two side edge of the bottom plate 22a are raised in opposed positions in the widthwise direction (in FIGS. 3 and 6 arrow Y1 direction) of the bottom plate 22a.

In the present embodiment, on the surface where the bottom plate 22a and the crimp claws 22b contact with the conductor folded portion DK2, as shown in FIG. 4, groove-like serrations 22c are formed.

In the flat circuit body with terminals 1 of the present embodiment, as shown in FIG. 7, the crimp claws 22b are crimped to the conductor folded portion DK2 which is mounted on the bottom plate 22a in a direction that the bottom layer flat conductor 11a (base side) faces the bottom plate 22a as shown in FIGS. 5 and 6.

In particular, the crimp claws 22b are crimped onto the top layer flat conductor 11 (the side opposite to the base side) in the conductor folded portion DK2d. In a crimping step of crimping and shaping the crimp claws 22b, a crimp jig (forming die) that makes the crimp claws 22b to be curved from the distal end side of the crimp claws 22b to make the distal ends of the crimp claws 22b abut on the surface of the top layer flat conductor 11b (the side opposite to the base side) is used, although the crimp jig is not shown in the figures.

Thus, by crimping the crimp claws 22b, as shown in FIG. 8, the bottom layer flat conductor 11a (base side) closely contacts with the bottom plate 22a in a surface contact state, and the top layer flat conductor 11b (the side opposite to the base side) is deformed plastically to be buried into gaps between the top layer and the curved crimp claws 22b to closely contact with the inner surfaces of the crimp claws 22b. After the crimp claws 22b are crimped to the conductor folded portion DK2, the circuit connecting part 22 of the terminal 20 is crimped to connect to the flat conductor 11. The top layer flat conductor 11b includes a tip end of the conductor exposed portion DR2, and the bottom layer flat conductor 11a is connected to a portion covered by the insulating layer 12.

A manufacturing method of the flat circuit body with terminals 1 of the first embodiment as described above sequentially performs an exposed portion forming step, a folded portion forming step, a folded portion mounting step and a crimping step shown as follows.

The exposed portion forming step is a step of forming the conductor exposed portion DR2 in the flat circuit body 10 which is formed to a planar wiring member by covering a plurality of flat conductors 11, which are separated at a predetermined interval and arranged into a planar shape, with the insulating layers 12, by stripping the insulating layers 12 to expose the flat conductors 11, as shown in FIG. 1. When a flat circuit body 1 in which a part of the flat conductors 11 are exposed beforehand is used, the exposed portion forming step is omitted.

The folded portion forming step is a step of forming the conductor folded portion DK2 in which both the bottom layer (base side) and the top layer (the side opposite to the base side) of the flat conductors 11 are exposed as shown in FIG. 2, by folding the conductor exposed portion DR2 at least one time in the length direction of the conductor exposed portion DR2.

The folded portion mounting step is a step of mounting the folded portion DK2 on the bottom plate 22a in a direction that the bottom layer flat conductor 11 (base side) exposed in the folded portion DK2 faces the bottom plate 22a, as shown in FIGS. 5 and 6.

The crimping step is a step of crimping the crimp claws 22b onto the top layer flat conductor 11 (the side opposite to the base side) in the conductor folded portion DK2 mounted on the bottom plate 22a, as shown in FIGS. 7 and 8. In the crimping step, as shown in FIG. 8, the bottom layer flat conductor 11 (base side) closely contacts with the bottom plate 22a in a surface contact state, and the top layer flat conductor 11 (the side opposite to the base side) is deformed plastically to be buried into gaps between the top layer and the curved crimp claws 22b to closely contact with the inner surfaces of the crimp claws 22b, so that the flat conductor 11 and the terminal 20 reach a crimped connection state.

In the flat circuit body with terminals 1 of the first embodiment described above, with the construction that the crimp claws 22b of the terminal 20 are crimped to the conductor folded portion DK2 in which a plurality of flat conductors 11 are overlapped, when compared with a case of simply crimping the circuit connecting part 22 to one layer of the flat conductor 11, mechanical connection strength can be improved and a high connection strength in the crimped portion of the terminal 20 can be secured.

In the flat circuit body with terminals 1 of the first embodiment described above, since the crimp claws 22b which are crimped to the conductor folded portion DK2 are raised in opposed positions at the two side edges of the bottom plate 22a of the terminal 20, crimp forces can be equally applied at both sides of the bottom plate 22a. Therefore, the overall width of the flat conductor 11 of the flat circuit body 10 closely contacts with the terminal 20 equally so that electrical connection performance can be improved by the increase of the contact area.

In addition, since the structure of crimping the crimp claws 22b and the degree of crimping are prescribed so that when the crimp claws 22b are crimped, the bottom layer flat conductor 11 closely contacts with the bottom plate 22a in a surface contact state, and the top layer flat conductor 11 (the side opposite to the base side) is deformed plastically to be buried into gaps between the top layer and the curved crimp claws 22b to closely contact with the inner surfaces of the crimp claws 22b, a variation of the mechanical connection strength or electrical connection performance of the terminal 20 can be prevented by crimping the crimp claws 22b.

In the flat circuit body with terminals 1 of the first embodiment described above, since the serrations 22c formed at the bottom plate 22a and the crimp claws 22b have a slippery resistant effect relative to the conductor folded portion DK2 that contact with the serrations 22c, the connection strength can be further improved by crimping the crimp claws 22b.

By performing the previously described steps in the manufacturing method of the flat circuit body with terminals 1 of the first embodiment described above, the flat circuit body with terminals 1 of the first embodiment can be manufactured. That is, not only a high connection strength at the crimped part of the terminal 20 can be secured, but also electrical connection performance can be improved by the increase of the contact area in the crimped part. Besides, the flat circuit body with terminals 1 for which a variation of mechanical connection strength or electrical connection performance of the terminal 20 can be prevented by crimping the crimp claws 22b can be manufactured.

Figure 9B:
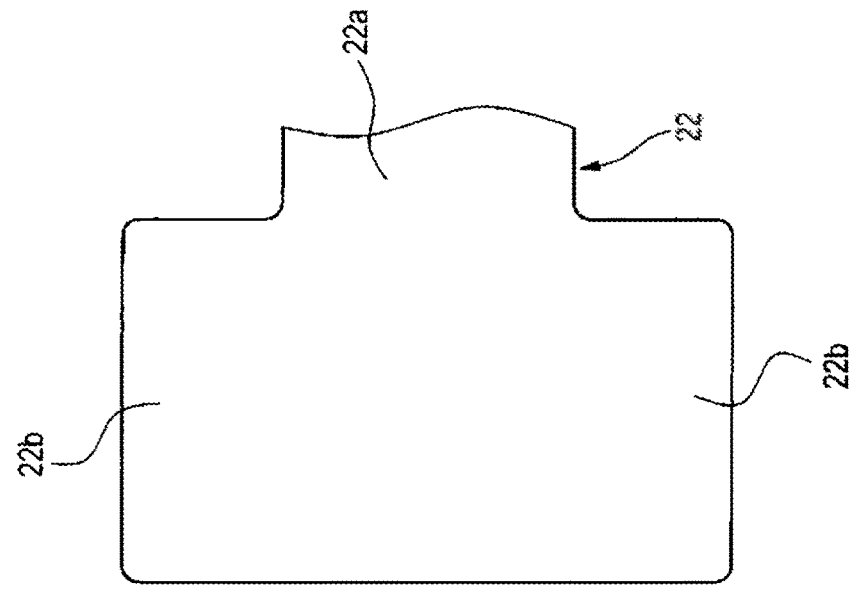
Figure 9A:
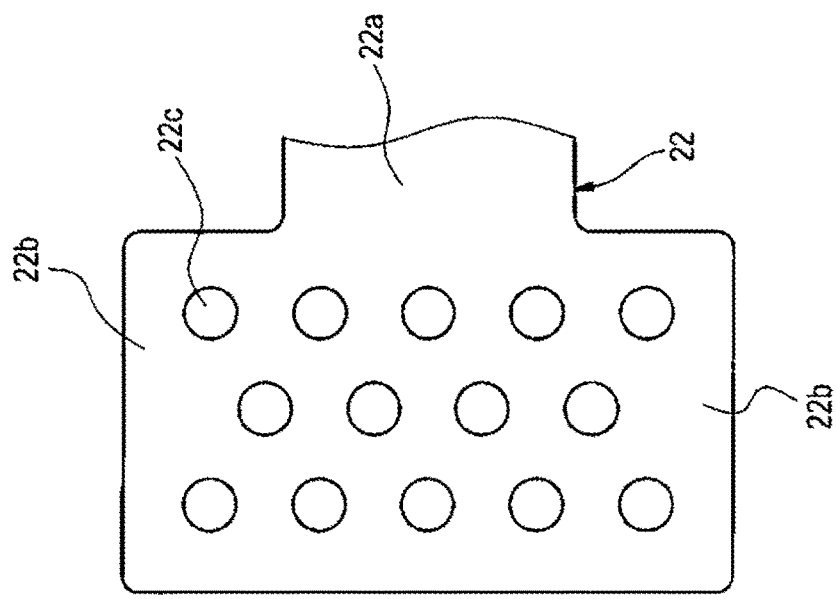

The specific structure of the circuit connecting part of the terminal as used in the present invention is not limited to the structure of the first embodiment. For example, in the circuit connecting part 22, a structure may be made in which circular recess-like serrations 22c are provided as shown in FIG. 9A, or a structure may be made in which serrations are not provided as shown in FIG. 9B.

In the flat circuit body with terminals of the present invention, the number of folding the flat conductors 11 to form the conductor folded portion is not limited to one, but it is possible to set to two or more. That is, in the present invention, it is preferred to obtain a form of the conductor folded portion that the flat conductors of both the bottom layer and the top layer are exposed by folding the conductor exposed portion DR2 once or more in the length direction.

Figure 10:
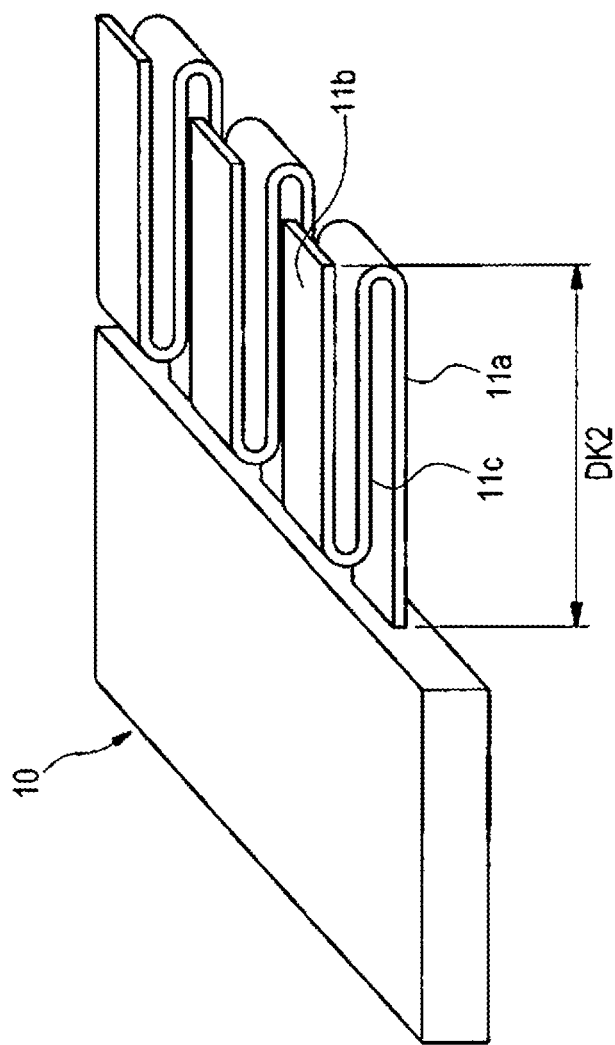
FIG. 10 is a perspective view of a conductor folded portion in a flat circuit body with terminals according to a second embodiment of the present invention.
Figure 11:
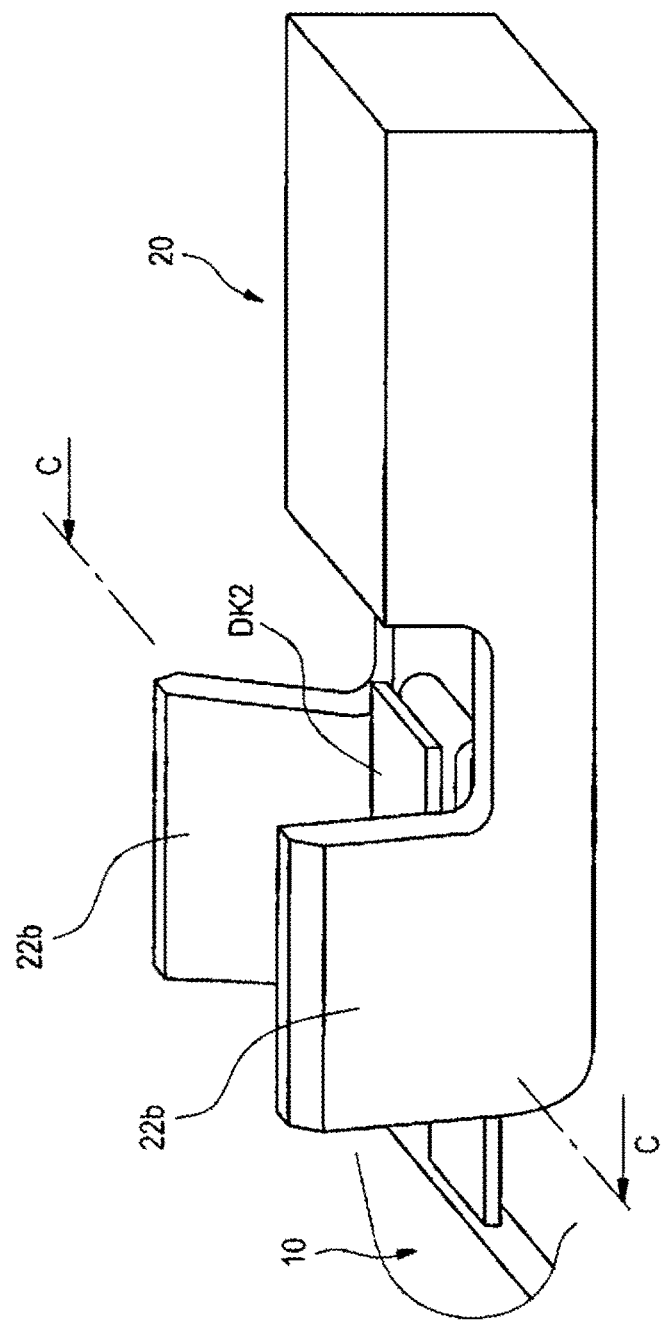
FIG. 11 is a perspective view which shows a state that the conductor folded portion shown in FIG. 10 is carried on the bottom plate of the terminal.
Figure 12:
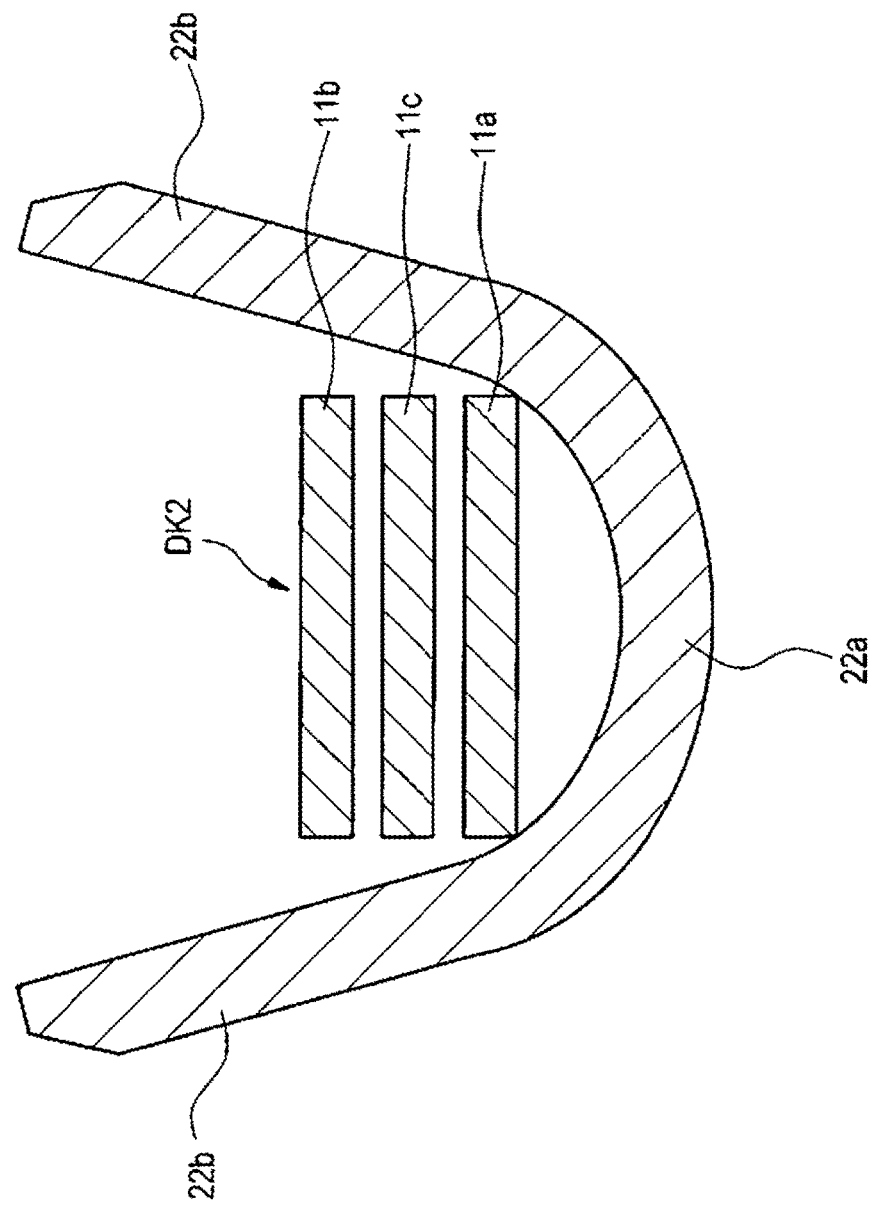
FIG. 12 is a C-C sectional view of FIG. 11.
Figure 13:
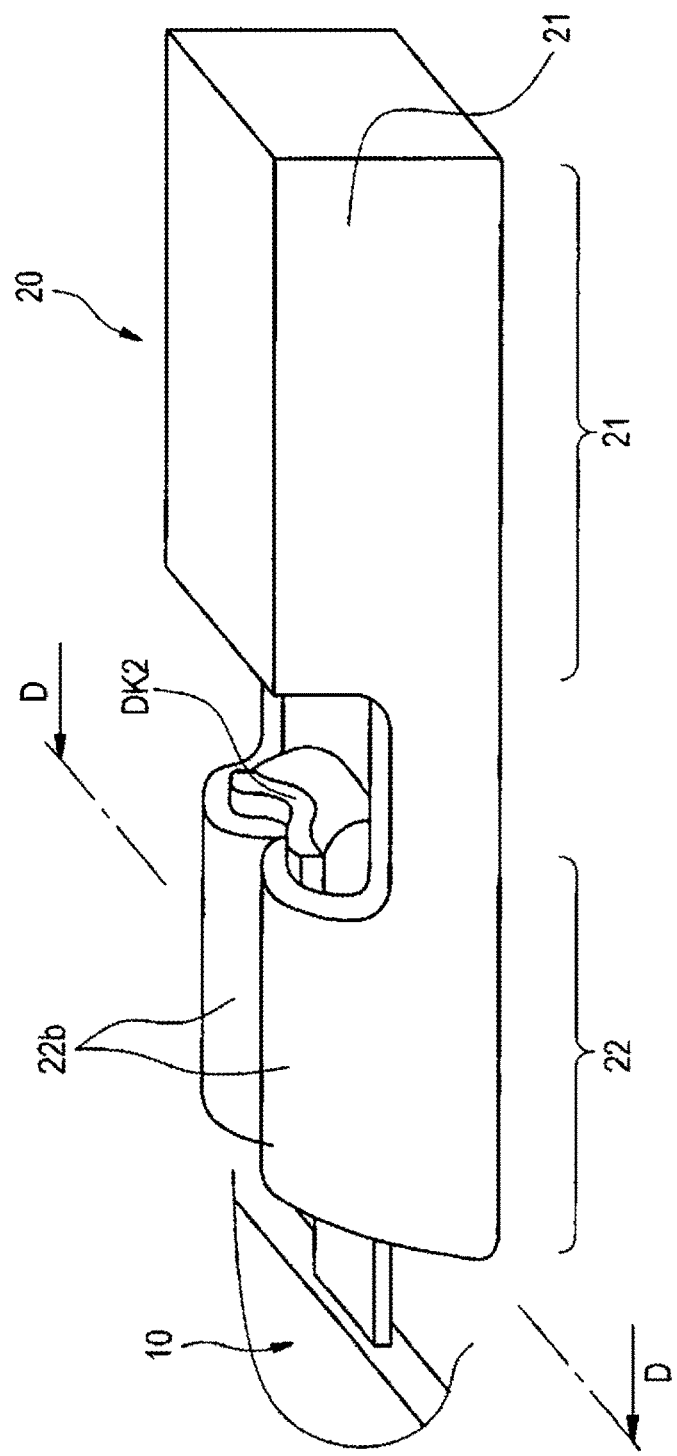
FIG. 13 is a perspective view which shows a state that the crimp claws of the terminal are crimped to the conductor folded portion shown in FIG. 10.
Figure 14:
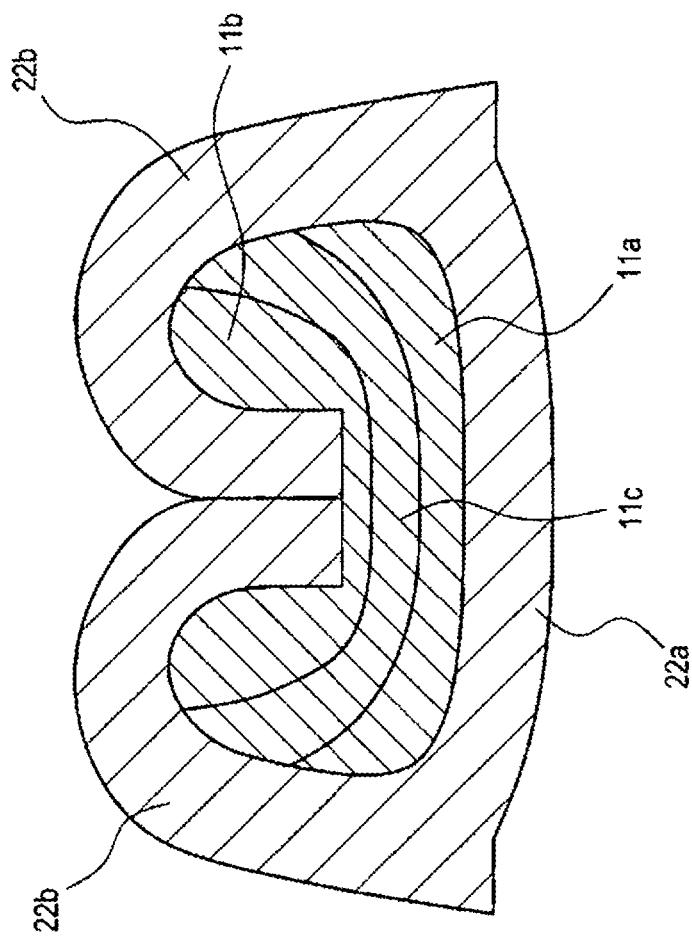
FIG. 14 is a D-D sectional view of FIG. 13.

FIGS. 10 to 14 show a flat circuit body with terminals according to a second embodiment of the present invention. FIG. 10 is a perspective view of a conductor folded portion of the flat circuit body with terminals in the second embodiment. FIG. 11 is a perspective view which shows a state that the conductor folded portion shown in FIG. 10 is carried on the bottom plate of the terminal. FIG. 12 is a C-C sectional view of FIG. 11. FIG. 13 is a perspective view which shows a state that the crimp claws of the terminal are crimped to the conductor folded portion shown in FIG. 10. FIG. 14 is a D-D sectional view of FIG. 13.

In a flat circuit body with terminals of the second embodiment, by folding the flat conductors 11 exposed in the conductor exposed portion twice in the length direction, the conductor folded portion DK2 formed in the flat circuit body 10 is constructed so that three layers of flat conductors, namely, a bottom layer flat conductor 11*a*, a middle layer flat conductor 11*b* and a top layer flat conductor 11*c* overlap. In this case, as shown in FIG. 12, the conductor folded portion DK2 is carried on the bottom plate 22*a* so that the bottom layer flat conductor 11*a* faces the bottom plate 22*a* of the terminal 20.

Thus, by crimping the crimp claws 22*b* onto the top layer flat conductor 11*b* in the conductor folded portion DK2 which is carried on the bottom plate 22*a*, as shown in FIGS. 13 and 14, the bottom layer flat conductor 11*a* closely contacts with the bottom plate 22*a* in a surface contact state, and the top layer flat conductor 11*b* is deformed plastically to be buried into gaps between the top layer and the curved crimp claws 22*b* to closely contact with the inner surfaces of the crimp claws 22*b*.

In the second embodiment, the same effects as those of the first embodiment can be obtained. Furthermore, in the second embodiment, because of the structure that three layers of the flat conductors 11 overlap in the conductor folded portion DK2, the strength in the crimped part can be further improved than that of the first embodiment in which two layers of the flat conductors 11 overlap.

Figure 15:
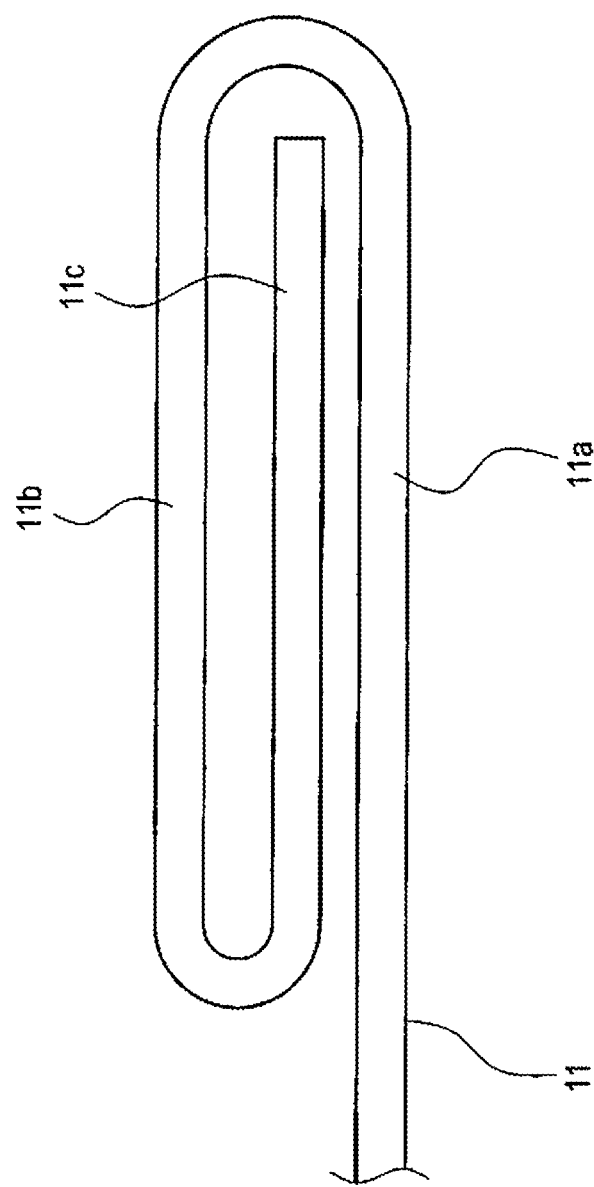
FIG. 15 is a side view of a conductor folded portion in which a structure that three layers of flat conductors are overlapped is formed by folding the flat conductors exposed in the conductor exposed portion twice, according to another embodiment of the invention.

When the conductor folded portion DK2 of the 3 layers structure is formed, the direction that the flat conductors 11 are folded is not limited to that shown in FIG. 10. As shown in FIG. 15, it is also possible to perform the folding twice so that the distal end of the flat conductor 11 is enrolled inwards.

Figure 16:
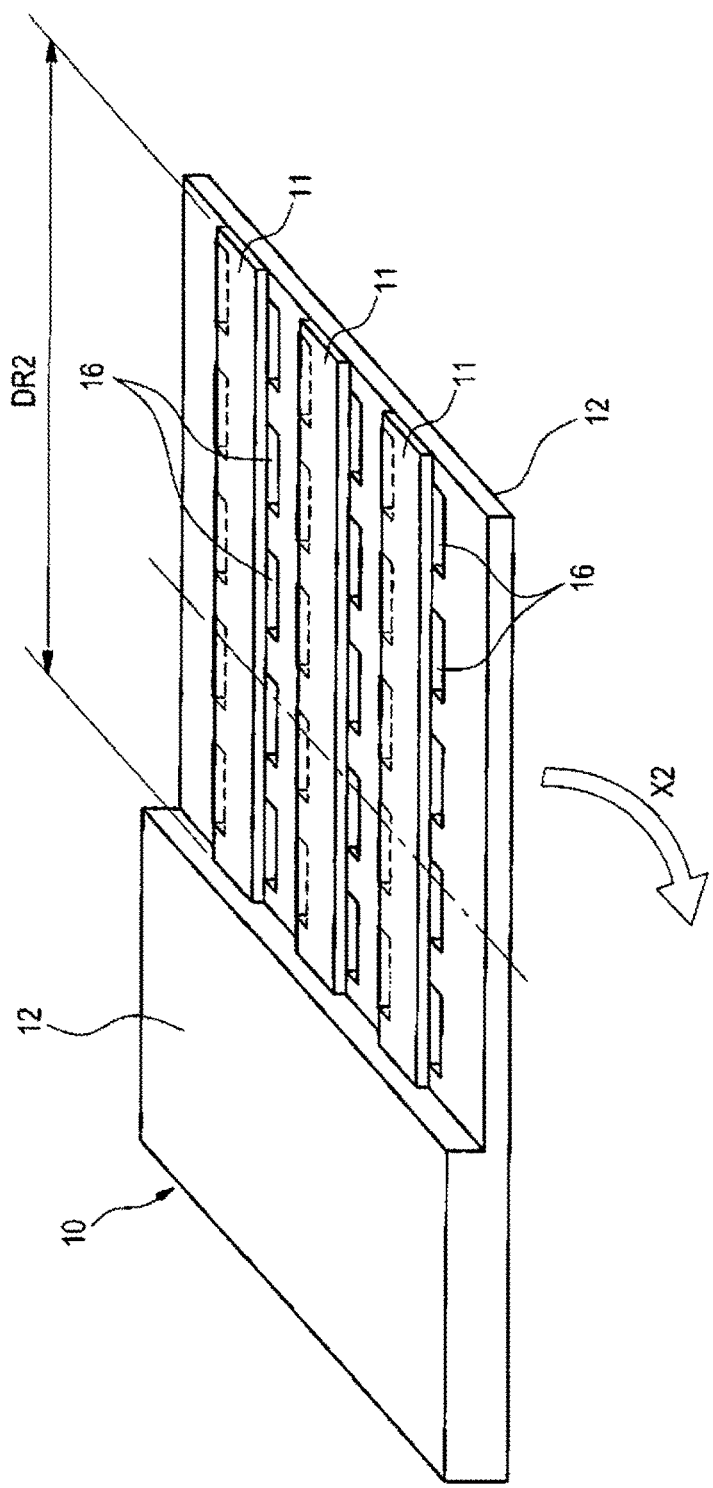
FIG. 16 is a perspective view of a conductor exposed portion in a flat circuit body with terminals according to a third embodiment of the present invention.
Figure 17:
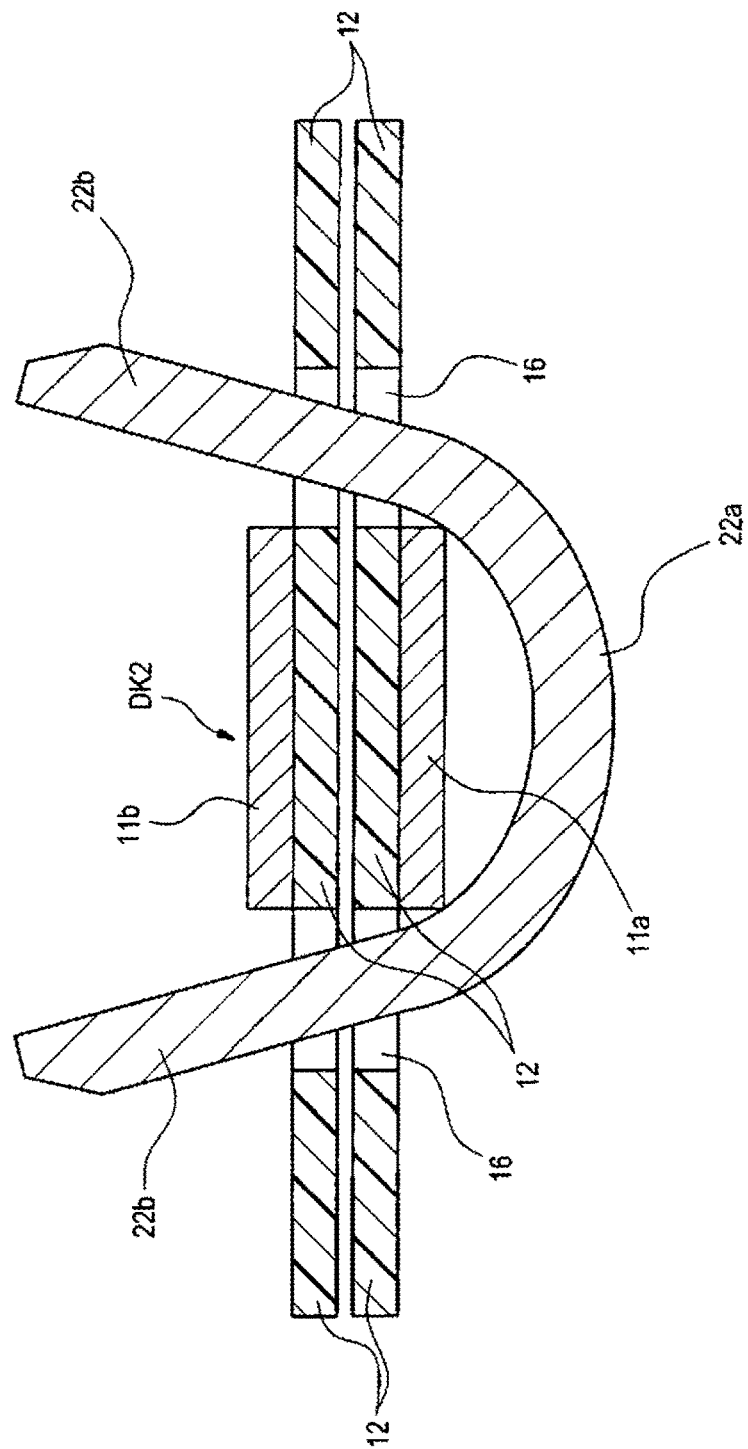
FIG. 17 is a cross sectional view which shows a state that a conductor folded portion formed by folding the conductor exposed portion shown in FIG. 16 one time is carried on the bottom plate of the terminal.
Figure 18:
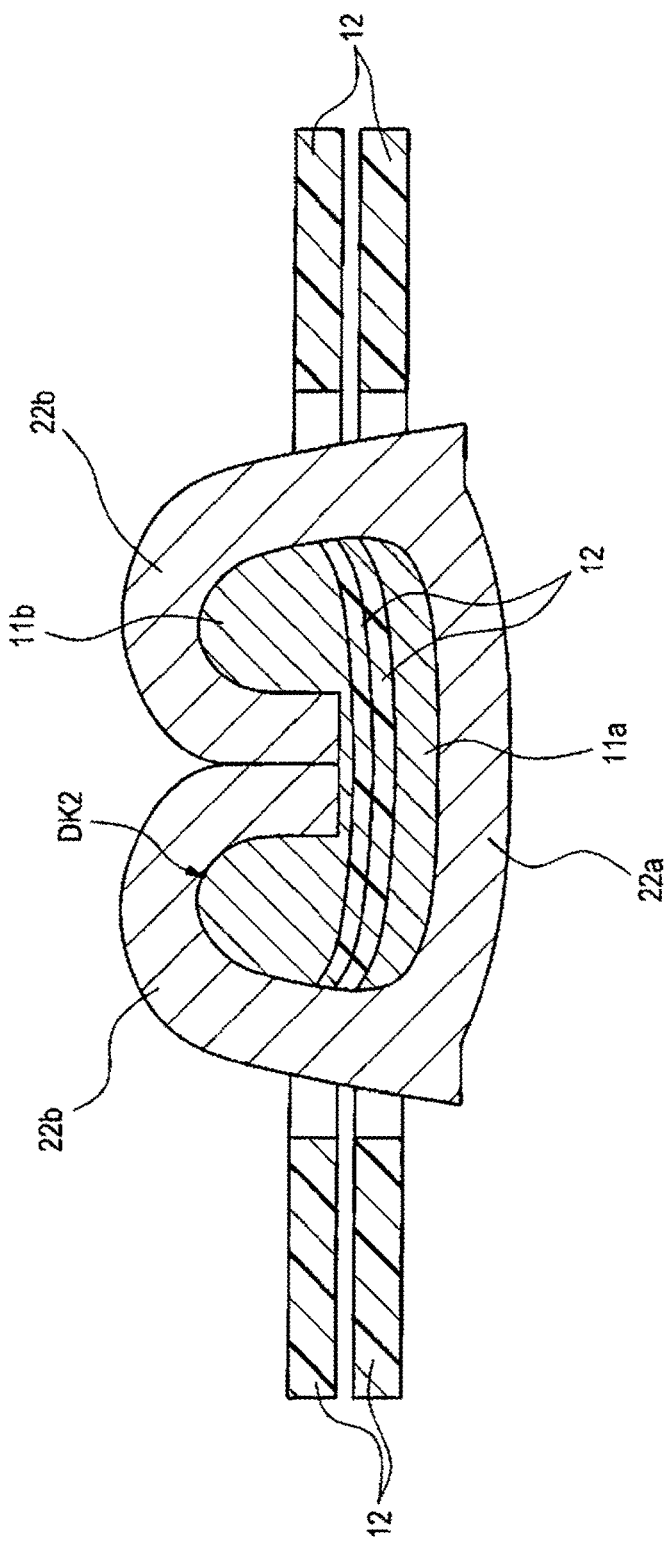
FIG. 18 is a cross sectional view which shows a state that the crimp claws are crimped to the conductor folded portion shown in FIG. 17.

FIGS. 16 to 18 show a flat circuit body with terminals according to a third embodiment of the present invention. FIG. 16 is a perspective view of a conductor exposed portion of the flat circuit body with terminals in the third embodiment. FIG. 17 is a cross sectional view which shows a state that a conductor folded portion formed by folding the conductor exposed portion shown in FIG. 16 one time is carried on the bottom plate of the terminal. FIG. 18 is a cross sectional view which shows a state that the crimp claws are crimped to the conductor folded portion shown in FIG. 17.

In the third embodiment, as shown in FIG. 16, in a conductor exposed portion DR2 formed in a flat circuit body 10, insulating layers 12 covering surfaces at one side of the flat conductors 11 and insulating layers 12 tied between adjacent flat conductors 11 are left. Therefore, only the surfaces at one side of the flat conductors 11 are exposed.

Furthermore, in the conductor exposed portion DR2 in the third embodiment, slits 16 which penetrate the circuit body in the thickness direction are provided at a predetermined interval along the edges of the flat conductors 11 in the insulating layers 12 between adjacent flat conductors 11.

As shown in FIG. 17, the slits 16 have such a width and a length that the crimp claws 22*b* of the terminal 20 can be inserted. The slits 16 are formed along the two side edges of the flat conductors 11.

For the conductor exposed portion DR2 as shown in FIG. 16, by folding the flat conductor 11 in the conductor exposed portion DR2 one time in the length direction so that the insulating layers 12 covering the surfaces at one side of the flat conductor 11 are overlapped, as shown in FIG. 17, a conductor folded portion DK2 is formed in which both the bottom layer flat conductor 11*a* (base side) and the top layer flat conductor 11*b* (the side opposite to the base side) of the flat conductors 11 are exposed. An arrow X2 of FIG. 16 shows a folding position of the flat conductors 11. Even in the case of folding as shown with the arrow X2 in FIG. 16, the conductor exposed portion DR2 is carried on the bottom plate 20*a* of the terminal 20 with the flat conductors 11 at the base side as the bottom layer flat conductors 11*a*. As shown in FIG. 17, the conductor folded portion DK2 is carried on the bottom plate 22*a* of the terminal 20 by inserting the crimp claws 22*b* of the terminal 20 into the slits 16. The flat conductors 11 are carried in a way that the flat conductors 11*a* at the base side of the conductor folded portion DK2 face the bottom plate 22*a* of the terminal 20.

In the third embodiment, as shown in FIG. 18, by crimping the crimp claws 22*b* onto the top layer flat conductor 11*b* (the side opposite to the base side) in the conductor folded portion DK2 which is carried on the bottom plate 22*a*, the bottom layer flat conductor 11*a* (base side) closely contacts with the bottom plate 22*a* in a surface contact state, and the top layer flat conductor 11*b* (the side opposite to the base side) is deformed plastically to be buried into gaps between the top layer and the curved crimp claws 22*b* to closely contact with the inner surfaces of the crimp claws 22*b*.

In the case of the flat circuit body with terminals of the third embodiment, other than those functions and effects described in the first embodiment, the next functions and effects can be achieved.

That is, since the insulating layers 12 which are stripped when the conductor exposed portion DR2 is formed are on the surfaces at one side of the flat conductors 11, the forming operation of the conductor exposed portion DR2 becomes easy.

Even if the conductor exposed portion DR2 has such a form that the insulating layers 12 between adjacent flat conductors 11 are left as shown in FIG. 16, by inserting the crimp claws 22*b* of the terminal 20 into the slits 16, a state that the conductor folded portion DK2 is carried on the bottom plate 22*a* of the terminal 20 can be easily reached, and a step of mounting the terminal 20 to the flat circuit body 10 can be performed easily.

When the insulating layers 12 between the adjacent flat conductors 11 are cut from the conductor exposed portion DR2 shown in FIG. 16, a conductor exposed portion DR2 shown in FIG. 19 to be described later can be formed. When the conductor exposed portion DR2 in which the insulating layers 12 between the adjacent flat conductors 11 are cut in this way is formed, if there are the slits 16 along the side edges of the flat conductors 11 like the third embodiment, the operation of cutting the insulating layers 12 between the adjacent flat conductors 11 becomes easy. Therefore, when the conductor exposed portion DR2 is formed in which a plurality of the flat conductors 11 of the flat circuit body 10 are separated from each other in the widthwise direction as shown in FIG. 19, the forming operation of the conductor exposed portion DR2 can be performed easily.

Figure 19:
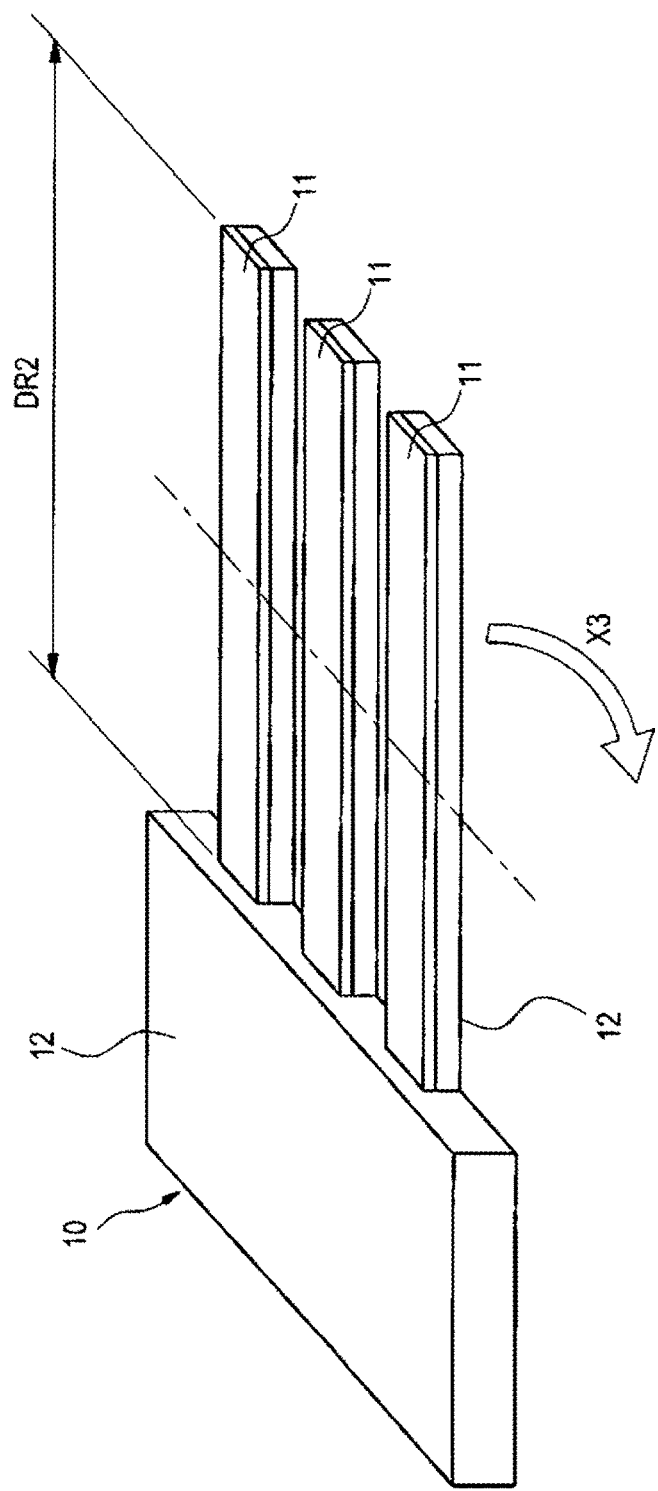
FIG. 19 is a perspective view of a conductor exposed portion in a flat circuit body with terminals according to a fourth embodiment of the present invention.
Figure 20:
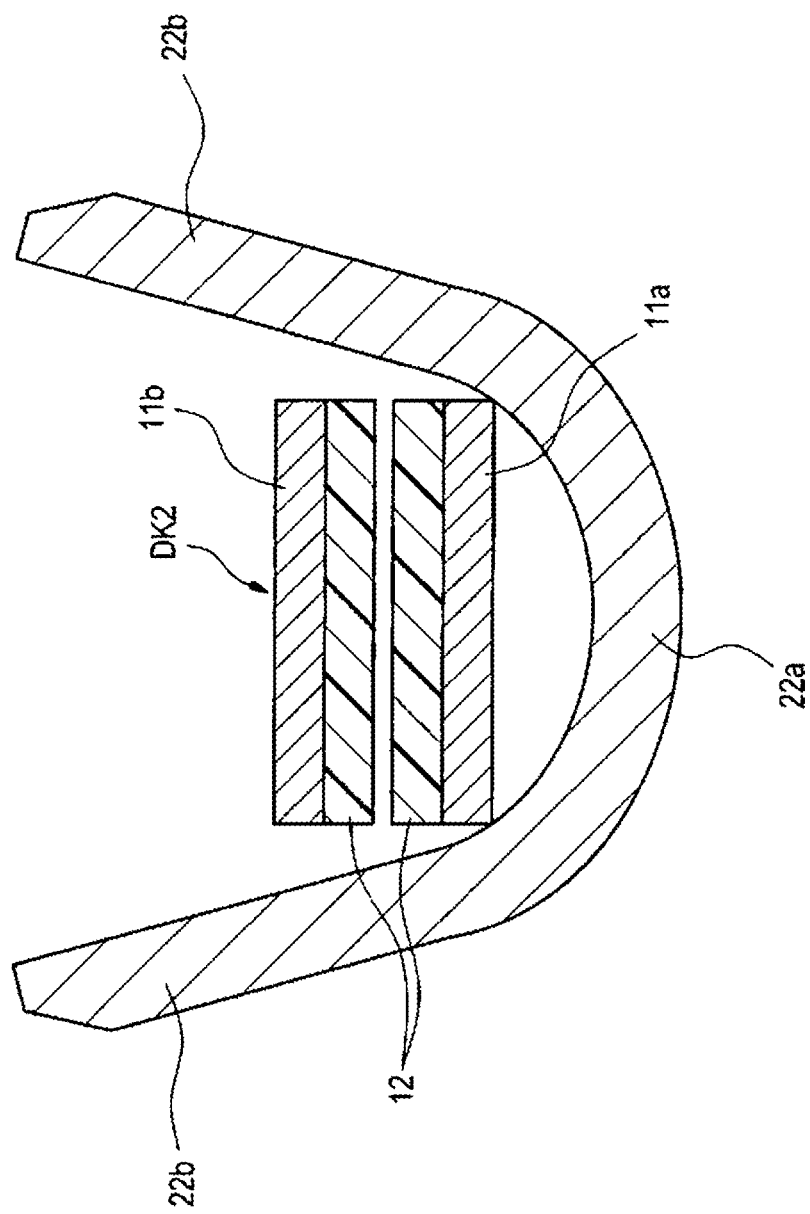
FIG. 20 is a cross sectional view which shows a state that a conductor folded portion formed by folding the conductor exposed portion shown in FIG. 19 one time is carried on the bottom plate of the terminal.
Figure 21:
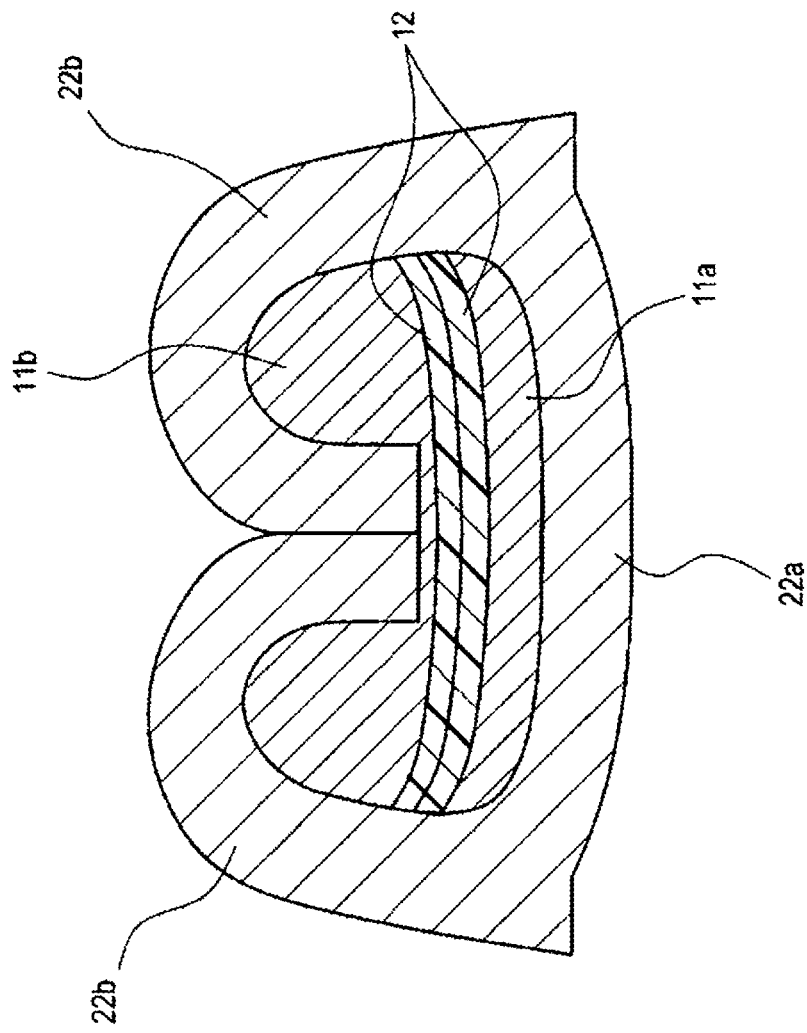
FIG. 21 is a cross sectional view which shows a state that the crimp claws are crimped to the conductor folded portion shown in FIG. 20.

FIGS. 19 to 21 show a flat circuit body with terminals according to a fourth embodiment of the present invention. FIG. 19 is a perspective view of a conductor exposed portion of the flat circuit body with terminals in the fourth embodiment. FIG. 20 is a cross sectional view which shows a state that a conductor folded portion formed by folding the conductor exposed portion of FIG. 19 one time is carried on the bottom plate of the terminal. FIG. 21 is a cross sectional view which shows a state that the crimp claws are crimped to the conductor folded portion shown in FIG. 20.

In the fourth embodiment, the conductor exposed portion DR2 formed in the flat circuit body 10 is constructed by cutting the insulating layers 12 between the flat conductors 11 from the conductor exposed portion DR2 shown in the third embodiment.

For the conductor exposed portion DR2 as shown in FIG. 19, by folding the flat conductor 11 in the conductor exposed portion DR2 one time in the length direction so that the insulating layers 12 covering the surfaces at one side of the flat conductor 11 are overlapped, as shown in FIG. 20, a conductor folded portion DK2 is formed in which both the bottom layer flat conductor 11a (base side) and the top layer flat conductor 11b (the side opposite to the base side) of the flat conductors 11 are exposed. An arrow X3 of FIG. 19 shows a folding position of the flat conductors 11. Even in the case of folding as shown with the arrow X3 in FIG. 19, the conductor exposed portion DR2 is carried on the bottom plate 20a of the terminal 20 with the flat conductors 11 at the base side as the bottom layer flat conductors 11a. As shown in FIGS. 20 and 21, the conductor folded portion DK2 is carried on the bottom plate 22a of the terminal 20 in a direction that the flat conductor 11a at the base side faces the bottom plate 22a.

In the fourth embodiment, as shown in FIG. 21, by crimping the crimp claws 22b onto the top layer flat conductor 11b (the side opposite to the base side) in the conductor folded portion DK2 which is carried on the bottom plate 22a, the bottom layer flat conductor 11a (base side) closely contacts with the bottom plate 22a in a surface contact state, and the top layer flat conductor 11b (the side opposite to the base side) is deformed plastically to be buried into gaps between the top layer and the curved crimp claws 22b to closely contact with the inner surfaces of the crimp claws 22b.

As shown in the fourth embodiment, the flat conductors 11 in the conductor exposed portion DR2 may be constructed so that the surfaces at one side are covered with insulating layers 12.

Figure 22:
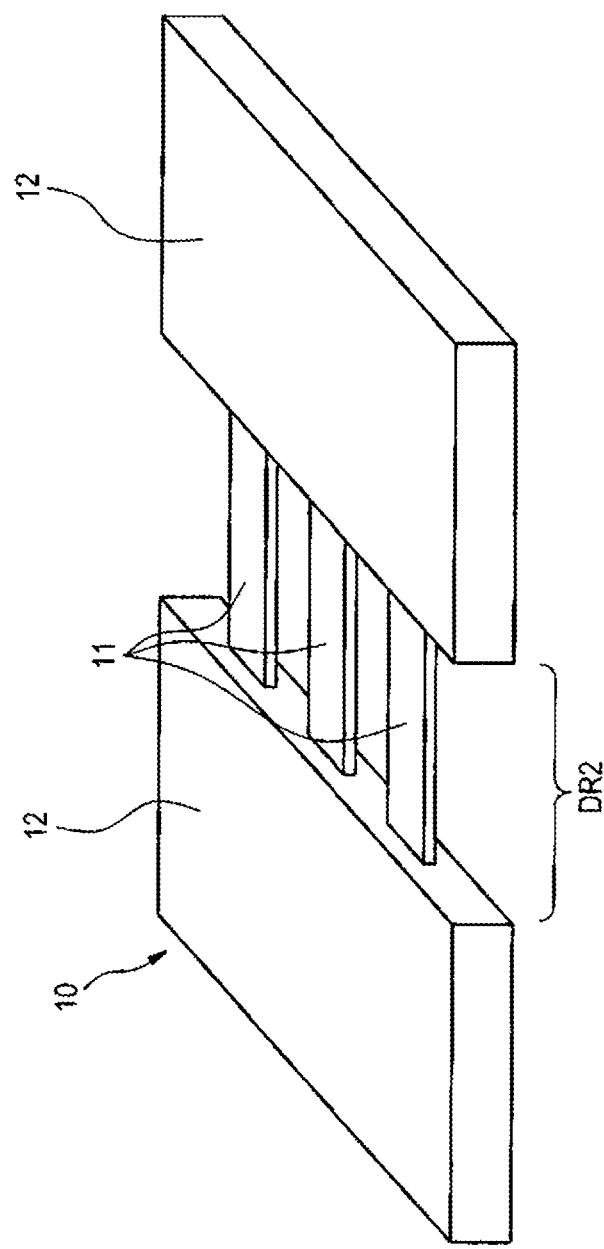
FIG. 22 is a perspective view of a conductor exposed portion in a flat circuit body with terminals according to a fifth embodiment of the present invention.
Figure 23:
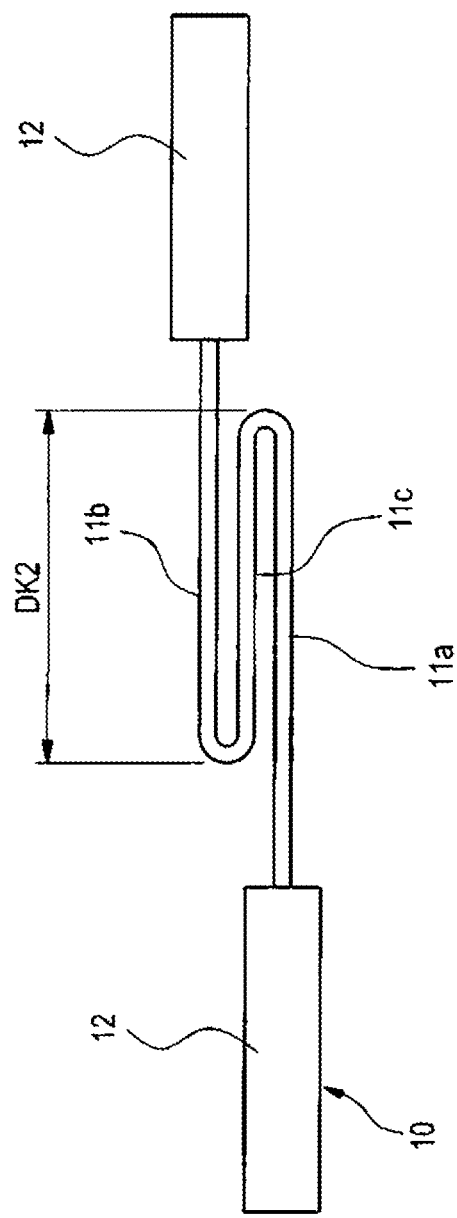
FIG. 23 is a side view of a conductor folded portion which is formed by folding the conductor exposed portion shown in FIG. 22 twice.

FIGS. 22 and 23 show a flat circuit body with terminals according to a fifth embodiment of the present invention. FIG. 22 is a perspective view of a conductor exposed portion of the flat circuit body with terminals in the fifth embodiment. FIG. 23 is a side view of a conductor folded portion which is formed by folding the conductor exposed portion of FIG. 22 twice.

In the fifth embodiment, a conductor exposed portion DR2 formed in the flat circuit body 10 differs from those in the previously described embodiments in that the conductor exposed portion DR2 is constructed by stripping the insulating layers 12 in a middle part of the flat circuit body 10 to expose the flat conductors 11.

In the fifth embodiment, by folding the flat conductors 11 of the conductor exposed portion DR2 shown in FIG. 22 twice in the length direction, a conductor folded portion DK2 in which three layers of the flat conductors 11 are overlapped as shown in FIG. 23 is formed, and the terminal 20 is crimped to connect to the conductor folded portion DK2.

As shown in the fifth embodiment, the part where the conductor exposed portion DR2 or the conductor folded portion DK2 is formed may be a middle part of the flat circuit body 10.

Figure 24:
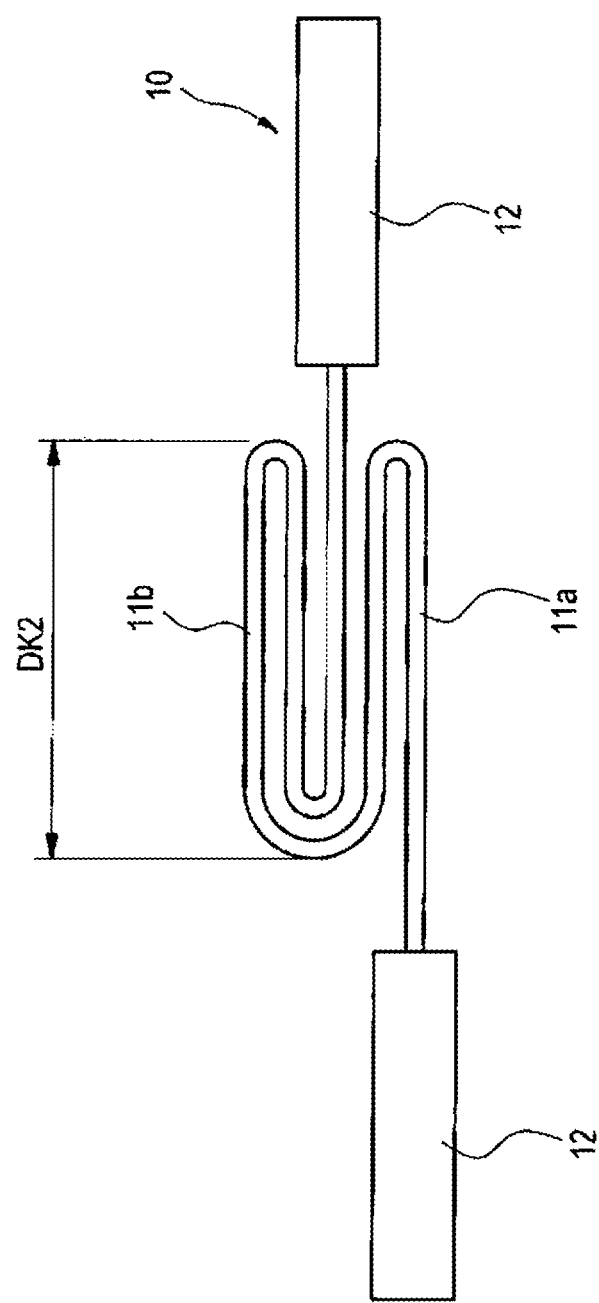
FIG. 24 is a side view of a conductor folded portion which is formed by folding the conductor exposed portion shown in FIG. 22 four times.
Figure 25:
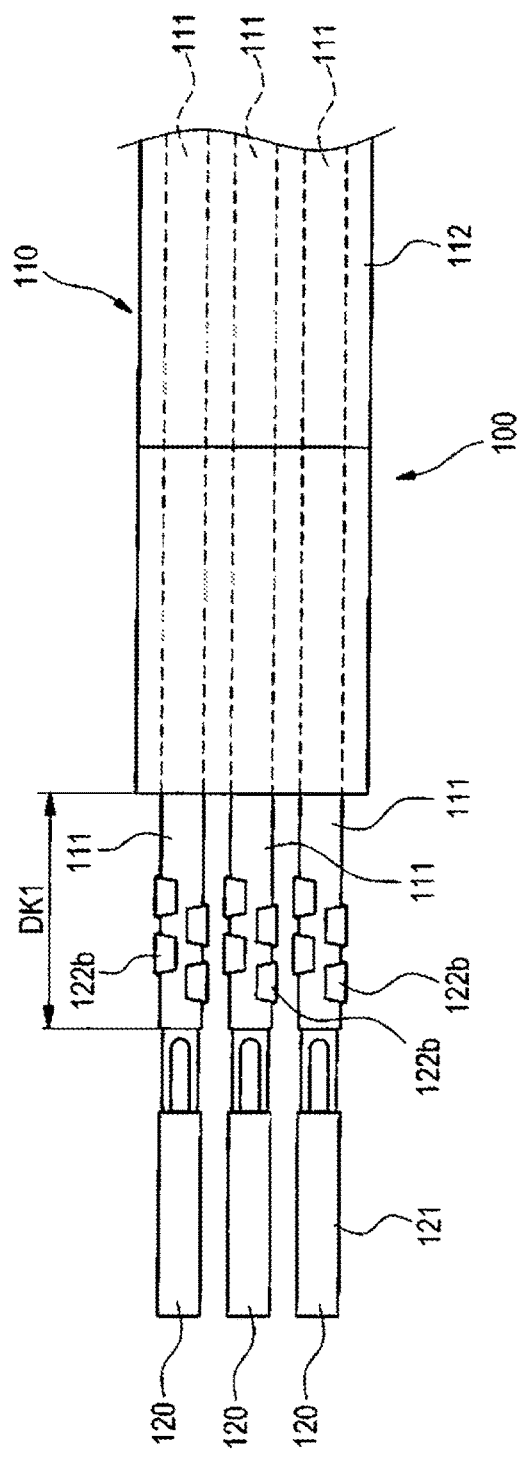
FIG. 25 is a top view of a connecting structure of a flat circuit body and terminals.
Figure 26:
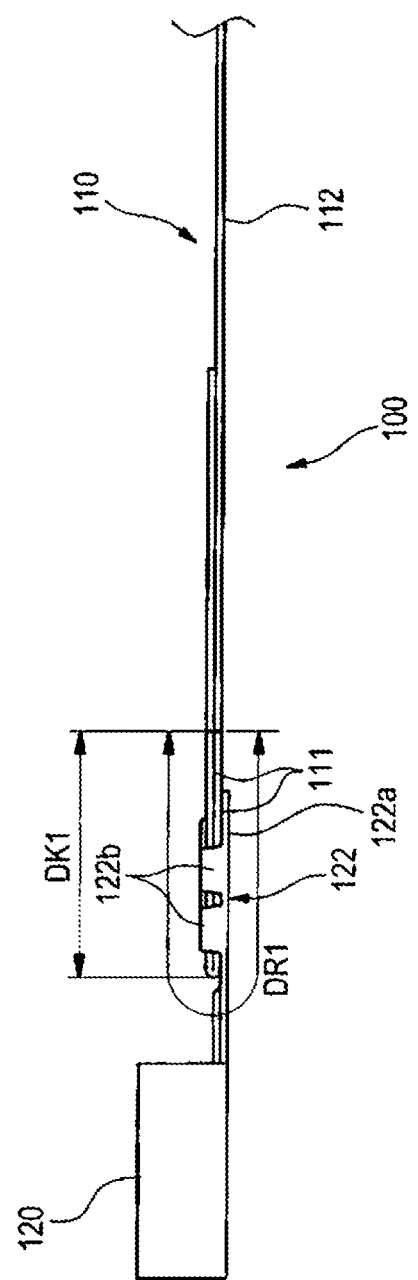
FIG. 26 is a side view which shows a state after the flat circuit body and the terminals shown in FIG. 25 are connected.

The number of folding the flat conductors 11 to form the conductor folded portion related to the invention can be arbitrarily selected as a number larger than one. In FIG. 24, by folding the conductor exposed portion DR2 formed in FIG. 22 four times, a conductor folded portion DK2 in which five layers of the flat conductors 11 are overlapped is formed.

All of the terminals which are used in the embodiments described above do not include insulating layer grasping claws which grasp the adjacent insulating layers 12 of the flat circuit body 10 outside the area of the conductor folded portion DK2. However, the terminal used in the present invention may be additionally equipped with the insulating layer grasping claws. By additionally equipping the terminal with the insulating layer grasping claws, the connection strength of the flat circuit body and the terminal can be further improved.

According to the present invention, there is provided a flat circuit body with terminals so that not only a high connection strength at the crimped part of the terminal can be secured, but also by making the overall width of the flat conductor of the flat conductor to contact with the terminal equally, electrical connection performance can be improved by the increase of the contact area, and besides, since the structure of crimping the crimp claws and the degree of crimping are prescribed, a variation of mechanical connection strength or electrical connection performance of the terminal can be prevented by crimping the crimp claws.

What is claimed is:
1. A flat circuit body with a terminal, comprising:
a flat circuit body including a flat conductor and an insulating layer covering at least one of surfaces of the flat conductor, a portion of the flat conductor being exposed from the insulating layer; and
a terminal including a bottom plate on which the exposed portion of the flat conductor is provided, and crimp claws which are raised at two side edges of the bottom plate so that the exposed portion of the flat conductor is disposed therebetween, wherein
the exposed portion of the flat conductor is folded so as to define a bottom layer which faces the bottom plate and a top layer which faces opposite to the bottom plate,
the top layer is configured to be plastically deformed so as to fill a gap between the top layer and inner surfaces of the crimp claws when the crimp claws are crimped onto the top layer, so that the bottom layer is in surface contact with the bottom plate, and
the exposed portion of the conductor includes a free tip end that is located between the bottom layer and the top layer, and a fold that connects the top layer to the bottom layer and extends along and covers a terminating face of the free tip end of the exposed portion of the flat conductor so that the free tip end is enrolled inwards by the fold.

2. The flat circuit body with the terminal according to claim 1, wherein
the flat circuit body includes a plurality of flat conductors which are arranged in a planar shape with separated at a predetermined interval.

3. A flat circuit body with the terminal, comprising:
a flat circuit body including a flat conductor and an insulating layer covering at least one of surfaces of the flat conductor, a portion of the flat conductor being exposed from the insulating layer; and
a terminal including a bottom plate on which the exposed portion of the flat conductor is provided, and crimp claws which are raised at two side edges of the bottom plate so that the exposed portion of the flat conductor is disposed therebetween, wherein the exposed portion of the flat conductor is folded so as to define a bottom layer which faces the bottom plate and a top layer which faces opposite to the bottom plate, the top layer is configured to be plastically deformed so as to fill a gap between the top layer and inner surfaces of the crimp claws when the crimp claws are crimped onto the top layer, so that the bottom layer is in surface contact with the bottom plate, and the insulating layer is formed with a respective plurality of slits penetrating the flat circuit body in a thickness direction thereof at a predetermined interval along a respective edge of each of the flat conductors, and the insulating layer covering the at least one of surfaces of the flat conductor is folded and overlapped and corresponding pairs of the respective plurality of slits are overlapped.

4. The flat circuit body with the terminal according to claim 1, wherein serrations are formed on a surface of the bottom plate facing the exposed portion of the flat conductor and the inner surface of the crimp claws.

5. The flat circuit body with the terminal according to claim 3, wherein the top layer includes a free tip end of the exposed portion of the flat conductor, and the bottom layer is connected to the exposed portion of the flat conductor.

6. The flat circuit body with the terminal according to claim 3, wherein the flat circuit body includes a plurality of flat conductors which are arranged in a planar shape with separated at a predetermined interval.

* * * * *